(12) United States Patent
Matusovsky et al.

(10) Patent No.: US 9,616,524 B2
(45) Date of Patent: Apr. 11, 2017

(54) LIGHT INDUCED PATTERNING

(75) Inventors: Mikhael Matusovsky, Rishon-LeZion (IL); Amir Noy, Kfar Mordechai (IL); Moshe Finarov, Rechovot (IL); Giora Dishon, Jerusalem (IL)

(73) Assignee: Utilight Ltd., Yavne (IL)

( * ) Notice: Subject to any disclaimer, the term of this patent is extended or adjusted under 35 U.S.C. 154(b) by 200 days.

(21) Appl. No.: 12/999,313

(22) PCT Filed: Jun. 18, 2009

(86) PCT No.: PCT/IL2009/000608
§ 371 (c)(1),
(2), (4) Date: Dec. 16, 2010

(87) PCT Pub. No.: WO2009/153792
PCT Pub. Date: Dec. 23, 2009

(65) Prior Publication Data

US 2011/0097550 A1     Apr. 28, 2011

(30) Foreign Application Priority Data

Jun. 19, 2008 (IL) .......................................... 192291
Oct. 12, 2008 (IL) ......................................... 194665
May 7, 2009 (IL) .......................................... 198629

(51) Int. Cl.
*C23C 14/28*     (2006.01)
*H05B 6/00*      (2006.01)
(Continued)

(52) U.S. Cl.
CPC ...... *B23K 26/0738* (2013.01); *B23K 26/0006* (2013.01); *B23K 26/0066* (2013.01);
(Continued)

(58) Field of Classification Search
CPC   B23K 20/08; B23K 26/0042; B23K 26/0051; C23C 14/048; C23C 14/04; C23C 14/28
(Continued)

(56) References Cited

U.S. PATENT DOCUMENTS 4,265,545 A    5/1981   Slaker
4,355,196 A    10/1982  Chai
(Continued)

FOREIGN PATENT DOCUMENTS

EP    0776051    5/1997
EP    1968121    9/2008
(Continued)

OTHER PUBLICATIONS

Pique et al; Applications of laser direct-write for embedding microelectronics; Proc. of SPIE vol. 6606, 66060R; 2007.*
(Continued)

*Primary Examiner* — Michael Wieczorek

(57) ABSTRACT

A method of depositing a material on a receiving substrate, the method comprising: providing a source substrate having a back surface and a front surface, the back surface carrying at least one piece of coating material; providing a receiving substrate positioned adjacent to the source substrate and facing the coating material; and radiating light towards the front surface of the source substrate, to remove at least one piece of the coating material from the source substrate and deposit said removed at least one piece onto the receiving substrate as a whole.

64 Claims, 13 Drawing Sheets

(51) Int. Cl.

| | | |
|---|---|---|
| B23K 26/073 | (2006.01) | |
| B23K 26/00 | (2014.01) | |
| B41M 5/382 | (2006.01) | |
| C23C 14/04 | (2006.01) | |
| H01L 31/0224 | (2006.01) | |
| H05K 3/20 | (2006.01) | |
| B23K 26/082 | (2014.01) | |
| B23K 101/40 | (2006.01) | |
| H05K 3/00 | (2006.01) | |
| B23K 101/34 | (2006.01) | |
| B23K 103/00 | (2006.01) | |

(52) U.S. Cl.
CPC ..... *B23K 26/0821* (2015.10); *B41M 5/38207* (2013.01); *B41M 5/38221* (2013.01); *C23C 14/04* (2013.01); *C23C 14/28* (2013.01); *H01L 31/022425* (2013.01); *H05K 3/207* (2013.01); *B23K 2201/34* (2013.01); *B23K 2201/40* (2013.01); *B23K 2203/56* (2015.10); *B41M 2205/02* (2013.01); *H05K 3/0097* (2013.01); *H05K 2201/0108* (2013.01); *H05K 2203/107* (2013.01); *Y02E 10/50* (2013.01); *Y10T 428/2457* (2015.01); *Y10T 428/24479* (2015.01)

(58) Field of Classification Search
USPC ....... 427/551, 552, 553, 554, 555, 595, 596, 427/597; 156/230, 247
See application file for complete search history.

(56) References Cited

U.S. PATENT DOCUMENTS

| | | | |
|---|---|---|---|
| 4,469,430 A | | 9/1984 | Terashima |
| 4,701,592 A | | 10/1987 | Cheung |
| 4,752,455 A | * | 6/1988 | Mayer ............ 427/597 |
| 4,970,196 A | | 11/1990 | Kim et al. |
| 5,021,808 A | * | 6/1991 | Kohyama ........... 347/66 |
| 5,156,938 A | | 10/1992 | Foley et al. |
| 5,168,454 A | | 12/1992 | LaPlante et al. |
| 5,173,441 A | * | 12/1992 | Yu et al. ............ 438/676 |
| 5,421,909 A | | 6/1995 | Ishikawa et al. |
| 5,654,975 A | | 8/1997 | Green et al. |
| 5,725,989 A | | 3/1998 | Chang et al. |
| 6,060,127 A | | 5/2000 | Tatah et al. |
| 6,177,151 B1 | * | 1/2001 | Chrisey et al. .......... 427/596 |
| 6,180,912 B1 | | 1/2001 | Tatah |
| 6,331,177 B1 | | 12/2001 | Munnerlyn et al. |
| 6,610,455 B1 | * | 8/2003 | Burberry et al. .......... 430/200 |
| 6,649,861 B2 | | 11/2003 | Duignan |
| 6,766,764 B1 | | 7/2004 | Chrisey et al. |
| 6,805,918 B2 | | 10/2004 | Auyeung et al. |
| 6,815,015 B2 | | 11/2004 | Young et al. |
| 6,921,626 B2 | | 7/2005 | Ray et al. |
| 7,001,467 B2 | | 2/2006 | Piqué et al. |
| 7,014,885 B1 | | 3/2006 | Pique et al. |
| 7,046,266 B1 | | 5/2006 | Retschke et al. |
| 7,217,334 B2 | * | 5/2007 | Toyoda ............ 156/230 |
| 7,335,555 B2 | | 2/2008 | Gee et al. |
| 7,339,110 B1 | | 3/2008 | Mulligan et al. |
| 2004/0056009 A1 | | 3/2004 | Gross et al. |
| 2005/0054121 A1 | * | 3/2005 | Handy et al. ............ 438/3 |
| 2005/0087289 A1 | | 4/2005 | Toyoda |
| 2005/0178431 A1 | | 8/2005 | Yang et al. |
| 2007/0052353 A1 | | 3/2007 | Yang et al. |
| 2007/0169806 A1 | | 7/2007 | Fork et al. |
| 2007/0178232 A1 | | 8/2007 | Kodas et al. |
| 2008/0072953 A1 | | 3/2008 | Stephens et al. |
| 2008/0113292 A1 | * | 5/2008 | Matsuo ............ 430/270.1 |
| 2008/0139075 A1 | * | 6/2008 | Birrell et al. ............ 445/61 |
| 2008/0202577 A1 | | 8/2008 | Hieslmair |
| 2008/0276986 A1 | | 11/2008 | Aberle et al. |
| 2009/0074987 A1 | * | 3/2009 | Auyeung et al. ............ 427/596 |
| 2009/0260685 A1 | | 10/2009 | Lee et al. |

FOREIGN PATENT DOCUMENTS

| | | |
|---|---|---|
| FR | 2400261 | 3/1979 |
| JP | 11-340162 | 12/1999 |
| WO | WO 2006/029250 | 3/2006 |
| WO | WO 2008/096904 | 9/2006 |
| WO | WO 2007/059577 | 5/2007 |
| WO | WO 2007/134300 | 11/2007 |
| WO | WO 2008/115814 | 9/2008 |
| WO | WO 2009/153792 | 12/2009 |
| WO | WO 2010/041262 | 4/2010 |

OTHER PUBLICATIONS

Schneiderloechner et al. "Scanning ND:YAG Laser System for Industrially Applicable Processing in Silicon Cell Manufacturing",Proceedings of 3rd World Conference on Photovoltaic Energy Conversion, 2: 1364-1367, 2003.
Office Action Dated Dec. 14, 2011 From the Israel Patent Office Re. Application No. 192291 and Its Translation Into English.
International Preliminary Report on Patentability Dated Aug. 3, 2010 From the International Preliminary Examining Authority Re.: Application No. PCT/IL2009/000608.
International Search Report and the Written Opinion Dated Dec. 27, 2009 From the International Searching Authority Re.: Application No. PCT/IL2009/000608.
Response Dated Mar. 24, 2010 to International Search Report and the Written Opinion of Dec. 27, 2009 From the International Searching Authority Re.: Application No. PCT/IL2009/000608.
Agostinelli et al. "Local Contact Structures for Industrial PERC-Type Solar Cells", 20th EU-PVSC, 4 P., 2005.
Agostinelli et al. "Silicon Solar Cells on Ultra-Thin Substrates for Large Scale Production", 21st EU PVSEC, Dresden, 2006.
Archer et al. "Clean Electricity From Photovoltaics", Series on Photoconversion of Solar Energy, vol. 1, 2001. Abstract.
Cesar et al. "Benchmark of Open Rear Side Solar Cell With Improved AL-BSF Process at ECN", 23rd European Photovoltaic Solar Energy Conference, Valencia, Spain, Sep. 1-5, 2008.
Choulat "High Efficiency Industrial Type PERC Solar Cell on Very Thin EFG Substrates", retrieved from the Internet.
Choulat et al. "Above 17% Industrial Type PERC Solar Cell on Thin Multi-Crystalline Silicon Substrate", 22nd European Photovoltaic Solar Energy Conference and Exhibition, Milano, Italy, Sep. 3-7, 2007.
Glunz et al. "Laser-Fired Contact Silicon Solar Cells on P- and N-Substrates", 19th European Photovoltaic Solar Eneregy Conference, Paris, France, Jun. 7-11, 2004.
Grohe et al. "Laser Technology for Contacting High-Efficiency Silicon Solar Cells the Laser-Fired Contacts Approach", 20th EU-PVSEC, 2 P., 2005.
Hofmann et al. "PECVD-ONO: A New Deposited Firing Stable Rear Surface Passivation Layer System for Crystalline Silicon Solar Cells", Advances in OptoElectronics, 2008(485467): 10 P., 2008.
Romijn et al. "Aspire: A New Industrial MWT Cell Technology Enabling High Efficiencies on Thin and Large MC-SI Wafers", Proceedings of the 22nd EU-PVSEC, 7 P., 2007.
Restriction Official Action Dated Jan. 15, 2013 From the US Patent and Trademark Office Re. U.S. Appl. No. 13/123,532.
Communication Relating to the Results of the Partial International Search Dated Jan. 20, 2011 From the International Searching Authority Re. Application No. PCT/IL2009/000976.
Narayanan "Fifty Years of Crystalline Silicon Solar Cells", Electro International, XP010305288, p. 678-683, Apr. 16-18, 1991. Fig.1.
Photovoltaic Insider's Report "Late News Developments", Photovoltaic Insider's Report, Dallas , TX, USA, XP000189851, 10(8), Aug. 2, 1991.
Verlinden et al. "Super Self-Aligned Technology for Backside Contact Solar Cells. A Route to Low Cost and High Efficiency", Conference Record of the 21st IEEE Photovoltaic Specialists Conference, Kissimee, FL, USA, May 21-25, 1990, XP010003187, p. 257-262, May 21, 1990. Fig. 1.
Office Action Dated Jan. 24, 2012 From the Israel Patent Office Re. Application No. 194665 and Its Translation Into English.

(56) References Cited

OTHER PUBLICATIONS

International Search Report and the Written Opinion Dated Mar. 7, 2011 From the International Searching Authority Re.: Application No. PCT/IL2009/000976.
Office Action Dated Mar. 11, 2012 From the Israel Patent Office Re. Application No. 198629 and Its Translation Into English.
Communication Pursuant to Article 94(3) EPC Dated Mar. 21, 2012 From the European Patent Office Re. Application No. 09766327.2.
International Preliminary Report on Patentability Dated Apr. 21, 2011 From the International Bureau of WIPO Re. Application No. PCT/IL2009/000976.
Search Report Dated Aug. 17, 2012 From the State Intellectual Property Office of the People's Republic of China Re. Application No. 200980133660.4.
Translation of Office Action Dated Aug. 17, 2012 From the State Intellectual Property Office of the People's Republic of China Re. Application No. 200980133660.4.
Office Action Dated May 20, 2013 From the Israel Patent Office Re. Application No. 198629 and Its Translation Into English.
Office Action Dated Apr. 29, 2013 From the Israel Patent Office Re. Application No. 212260 and Its Translation Into English.
Translation of Office Action Dated Mar. 13, 2013 From the State Intellectual Property Office Re. Application No. 200980151314.9.
Translation of Search Report Dated Mar. 13, 2013 From the State Intellectual Property Office Re. Application No. 200980151314.9.
Translation of Office Action Dated Apr. 28, 2013 From the State Intellectual Property Office of the People's Republic of China Re. Application No. 200980133660.4.
Official Action Dated Apr. 9, 2013 From the US Patent and Trademark Office Re. U.S. Appl. No. 13/123,532.
Verlinden et al. "Super Self-Aligned Technology for Backside Contact Solar Cells: A Route to Low Cost and High Efficiency", Conference Record of the 21st IEEE Photovoltaic Specialists Conference, Kissimmee, FL, USA, May 21-25, 1990, 1: 257-262, 1990.
Office Action Dated Jul. 15, 2013 From the Israel Patent Office Re. Application No. 192291 and Its Translation Into English.
Notification to Grant Patent Right for Invention Dated Feb. 7, 2014 From the State intellectual Property Office of the People's Republic of China Re. Application No. 200980133660.4 and Its Translation Into English.
Corrected Notice of Allowability Dated Jan. 16, 2014 From the US Patent and Trademark Office Re. U.S. Appl. No. 13/123,532.
Office Action Dated Dec. 9, 2013 From the Israel Patent Office Re. Application No. 210104 and Its Translation Into English.
Office Action Dated Dec. 25, 2013 From the State Intellectual Property Office Re. Application No. 200980151314.9 and Its Translation Into English.
Office Action Dated Oct. 7, 2014 From the Israel Patent Office Re. Application No. 210104 and Its Translation Into English.
Communication Pursuant to Article 94(3) EPC Dated Aug. 29, 2014 From the European Patent Office Re. Application No. 09766327.2.
Translation Dated Feb. 16, 2015 of Office Action Dated Feb. 2, 2015 From the Israel Patent Office Re. Application No. 212260.
Office Action Dated Feb. 2, 2015 From the Israel Patent Office Re. Application No. 212260.
Communication Pursuant to Article 94(3) EPC Dated Sep. 12, 2016 From the European Patent Office Re. Application No. 09760008.4.
Opposition to Application to Register Patent No. 210104 Dated Dec. 28, 2015 Before the Patent Registrar in Jerusalem, Israel, Pursuant to the Patent Law, 5727-1967 Re. Application No. 210104 and Its Translation Into English.
Arnold et al. "Laser Direct-Write Techniques for Printing of Complex Materials", MRS Bulletin, 32(1): 23-32, Jan. 2007.
Matusovsky Employment Contract of Mikhael Matusovsky Dated Oct. 21, 2002 by Orbotech® Ltd.
Noy Employment Contract of Amir Noy Dated Feb. 10, 1997 by Orbotech® Ltd.
PCB—AOI Summary of Meeting PCB—AOI Patent Forum Dated Feb. 14, 2008.
PCB—AOI Summary of Meeting PCB—AOI Patent Forum Dated Jan. 10, 2008.
Pique et al. "Laser Decal Transfer of Electronic Materials With Thin Film Characteristics", Photon Processing in Microelectronics and Photonics VII, San Jose, CA, USA, Jan. 21-24, 2008, Proceedings of the SPIE, 6879: 687911-1-687911-8, Jan. 2008.
Zhang et al. "Lamp-Induced Forward Transfer: A New Approach for Deposition of Metal Films", Journal of Materials Science Letters, 17(23): 2037-2040, Dec. 1998.

\* cited by examiner

LIGHT INDUCED PATTERNING

RELATED APPLICATIONS

This Application is a National Phase of PCT Patent Application No. PCT/IL2009/000608 having International filing date of Jun. 18, 2009, which claims priority from Israeli application no. 192291 filed on Jun. 19, 2008, Israeli application no. 194665 filed on Oct. 12, 2008 and Israeli application no. 198629 filed on May 7, 2009.

The contents of all of the above documents are incorporated by reference as if fully set forth herein.

FIELD AND BACKGROUND OF THE INVENTION

The present invention, in some embodiments thereof, relates to an apparatus and method for depositing a material from a source or target substrate onto a receiving substrate, and more particularly, but not exclusively, to depositing a patterned material from a target substrate onto a receiving substrate.

During the manufacturing process of some products it is desired to deposit a material, such as conductors, in a patterned form onto a receiving substrate. Such products may include for example, semiconductor integrated circuits (IC), semiconductor IC packaging connections, printed circuit boards (PCB), PCB components assembly, solar photovoltaic cells (PV cells), optical biological, chemical and environment sensors and detectors, RFID antennas, OLED displays (passive or active matrix), OLED illuminations sheets, printed batteries and more.

The prior art has used one of a number of methods for laying down such materials including, evaporation, masking and etching, ink-jet writing and silk screening. One method is deposition of strips of conductor material onto a substrate from a target substrate coated with a continuous layer of the material by selectively heating the side of the layer facing the substrate with a laser.

For example, U.S. Pat. No. 6,177,151 to Chrisey et al. discloses a device including a source of pulsed laser energy, a receiving substrate and a target substrate. The target substrate comprises a laser transparent support having a back surface and a front surface. The back surface has a continuous coating that comprises a mixture of the transfer material to be deposited and a matrix material. The matrix material is a material that has the property that, when it is exposed to pulsed laser energy, some of the components of it are volatile. The source of pulsed laser energy is positioned in relation to the target substrate so that pulsed laser energy is directed through the back surface of the target substrate and through the laser-transparent support to strike the coating at a defined location with sufficient energy to volatilize the volatile material at the location with enough force to cause a portion of the coating to desorb from the location, detach from the surrounding material and lift from the surface of the support. The receiving substrate is positioned in a spaced relation to the target substrate so that the part of transfer material in the desorbed coating is deposited at a defined location on the receiving substrate.

U.S. Pat. No. 7,001,467 to Piqué et al. discloses a system using two lasers. A first laser is positioned in relation to the target substrate so that a laser beam is directed through the back surface of the target substrate and through the laser-transparent support to strike the continuous coating at a defined location with sufficient energy to remove and lift at least the non-volatile portions of the source material from the surface of the support and detach it from the surrounding material. A second laser is then positioned to strike the deposited source material to transform the source material into the material of interest, for example to serve as an electrical conductor.

In the process of the production of some products, such as crystalline solar cells, the receiving substrate is coated with a passivation layer. It is desired to create openings in the passivation layer into which the material will be deposited. The prior art has performed this in two stages. First the openings are created in the passivation layer. Then, by use of direct writing (for example, using the methods of the two previously described patents), the material is deposited into the openings in the passivation layer of the substrate. Usually, the pattern is a set of parallel lines. This type of direct writing requires precise alignment of the laser and receiving substrate since the material has to be deposited from the continuously coated substrate into the openings that have been previously formed in the passivation layer. Another option is to use material which will penetrate into the passivation layer.

US 2008/0139075 to Birrell et al. describes the use of optical lenses to focus the laser beam on the target and the receiving substrates, thereby providing precise alignment of the two. Birrell explains that since the coating on the target substrate is relatively thin, two or more depositions of the coating are required at a single position on the receiving substrate. Since the target substrate has a continuous coating, the target substrate is moved with respect to the receiving substrate so that two or more material depositions are available at the same spot. A first lens is used to review the target substrate for available coating material the target substrate. A second lens is used to review the receiving substrate for places where the substrate requires material deposition.

US 2007/0169806 to Fork et al. uses a laser based or particle beam patterning system to define contact openings through a passivation layer to expose doped portions of the underlying wafer and then uses a direct write metallization apparatus, such as an inkjet-type printing apparatus or an extrusion-type deposition apparatus to deposit contact material into each of the contact openings.

Additional background art includes U.S. Pat. No. 6,805,918 to Auyeung et al., U.S. Pat. No. 6,815,015 to Young et al., U.S. Pat. No. 7,335,555 to Gee et al, U.S. Pat. No. 6,649,861 to Duignan, U.S. Pat. No. 4,265,545 to Slaker, U.S. Pat. No. 7,046,266 to Retschke et al. US 2004/0056009 to Gross et al., U.S. Pat. No. 6,331,177 to Mummerlyn et al., U.S. Pat. No. 5,654,975 to Green et al., U.S. Pat. No. 4,701,592 to Cheung et al., U.S. Pat. No. 4,469,430 to Terashima et al., U.S. Pat. No. 4,970,196 to Kim et al., U.S. Pat. No. 5,156,938 to Foley et al. and "Scanning ND: Yag Laser System for Industrially Applicable Processing in Silicon Solar Cell Manufacturing" by Schneiderlocher, E. et al.

SUMMARY OF THE INVENTION

According to an aspect of some embodiments of the present invention there is provided a source or target substrate carrying a patterned coating thereon, a receiving substrate and a light source adapted to radiate a light beam to the source substrate, thereby depositing the patterned coating from the source substrate onto the receiving substrate. In accordance with an exemplary embodiment of the invention, the patterned coating comprises at least one piece of coating material and the deposition of material is performed piece by piece. Optionally, each piece is deposited as a whole onto the receiving substrate without parts of the piece being detached from their surrounding coating material.

According to an aspect of some embodiments of the present invention there is provided a method of depositing a material on a receiving substrate, the method comprising:

providing a source substrate having a back surface and a front surface, the back surface carrying at least one piece of coating material;

providing a receiving substrate positioned adjacent to the source substrate and facing the coating material; and radiating light towards the front surface of the source substrate, to remove at least one piece of the coating material from the source substrate and deposit said removed at least one piece onto the receiving substrate as a whole.

According to some embodiments of the invention, deposit said removed at least one piece comprises deposit said removed at least one piece without detaching a part of said at least one piece from its surrounding coating material.

According to some embodiments of the invention, radiating light towards the front surface of the source substrate comprises heating the coating material thereby volatizing volatile material between the back surface of the source substrate and the coating material, which provides a force for removing the coating material from the back surface of the source substrate.

According to some embodiments of the invention, depositing at least one piece of the coating layer, comprises depositing a piece which has an aspect ratio of more than 0.1.

According to some embodiments of the invention, depositing at least one piece of the coating layer, comprises depositing a piece which has a height more than 5 µm.

According to some embodiments of the invention, radiating light towards the front surface of the source substrate, to remove at least one piece of the material from the source substrate comprises radiating the coating material once to remove at least one piece of material from the source substrate as a whole.

Optionally, radiating light comprises radiating a laser beam. Optionally, radiating light comprises radiating with a continuous laser radiation. Optionally, radiating light comprises radiating with a high repetition pulsed laser. Optionally, radiating light comprises radiating a broadband flash light beam. Optionally, radiating light comprises radiating a line. Optionally, radiating light comprises radiating light at a power less than 3 W.

According to some embodiments of the invention, radiating light comprises radiating a light beam which follows a pattern of the at least one piece of coating material. Optionally, radiating light comprises radiating light which covers the at least one piece of coating material carried by the source substrate.

According to some embodiments of the invention, the method further comprises adding coating material to the source substrate at a portion from which the coating material was deposited to the receiving substrate.

According to some embodiments of the invention, the method further comprises cleaning the source substrate at a portion from which the coating material was deposited to the receiving substrate.

According to some embodiments of the invention, the method further comprises radiating light towards the receiving substrate, to ablate openings in the receiving substrate.

According to some embodiments of the invention, the method further comprises aligning the source and receiving substrate such that radiating light radiated towards the source substrate will cause the removed piece of coating material to be deposited in the ablated opening in the receiving substrate.

According to some embodiments of the invention, providing a source substrate comprises providing a source substrate wherein said coating material includes a volatile admixture which volatizes when it is irradiated by the light. Optionally, providing a source substrate comprises providing a source substrate carrying at least two pieces of coating material, wherein the at least two pieces are unconnected to each other.

An aspect of some embodiments of the invention relates to a solar cell made of a silicon wafer, the wafer carrying conductor lines on at least one side of said wafer, the conductor lines deposited by said method.

According to some embodiments of the invention, a solar flat panel comprising a plurality of electrically connected solar cells.

An aspect of some embodiments of the invention, relates to a system for producing a receiving substrate, the system comprising:

a source substrate carrying patterned coating material which coats less than an entire surface of the source substrate;

a receiving substrate positioned adjacent the source substrate and facing the coating material; and a depositing light source adapted to radiate light towards the source substrate such that coating material will be deposited on the receiving substrate.

Optionally, the source substrate is transparent to the radiated light.

According to some embodiments of the invention, the source substrate comprises trenches in which the coating material is positioned. Optionally, said trenches comprise a bottom surface and two sidewalls, wherein the sidewalls of the trenches are coated with low surface energy material. Optionally, said trenches are formed as openings made in a metal layer coating the source substrate. Optionally, the bottom surface of the trenches is textured.

According to some embodiments of the invention, the source substrate carries at least two pieces of coating material which are made from different materials.

According to some embodiments of the invention, the coating material comprises a plurality of separate pieces of material. Optionally, the separate pieces of material are formed as lines. Optionally, the lines are straight lines. Optionally, the coating material is formed as a spiral.

According to some embodiments of the invention, the aspect ratio of the height and width of the coating material is approximately equal or higher than 0.1.

According to some embodiments of the invention, the height of the coating material is more than 5 µm.

According to some embodiments of the invention, the system further comprises an ablating light source adapted to radiate light for ablating openings in the receiving substrate. Optionally, the ablating light source and the depositing light source comprise a single light source. Optionally, the ablating light source and the depositing light source are two different light sources radiating light at different energies.

According to some embodiments of the invention, the system further comprises a controller adapted to align the source and receiving substrate such that the coating material will be deposited in the openings in the receiving substrate.

According to some embodiments of the invention, the system comprises a plurality of receiving substrates moving below the radiated light.

According to some embodiments of the invention, the system further comprises a filling station adapted for filling the source substrate with coating material.

According to some embodiments of the invention, the system further comprises a cleaning station adapted for cleaning the source substrate after material deposition therefrom.

According to some embodiments of the invention, the depositing light source is adapted to radiate a broadband flash light beam. Optionally, the depositing light source is adapted to radiate a laser beam.

According to some embodiments of the invention, the system further comprises a beam scanner adapted to transform the laser beam into a scan line.

According to some embodiments of the invention, the depositing light source is adapted to provide raster line scanning.

According to some embodiments of the invention, the coating material includes a volatile admixture adapted to volatize when radiated by the light.

According to some embodiments of the invention, a volatile admixture is provided between the source substrate and the coating material.

According to some embodiments of the invention, the receiving substrate is positioned below the source substrate.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings.

DESCRIPTION OF EMBODIMENTS OF THE INVENTION

Figure 1:
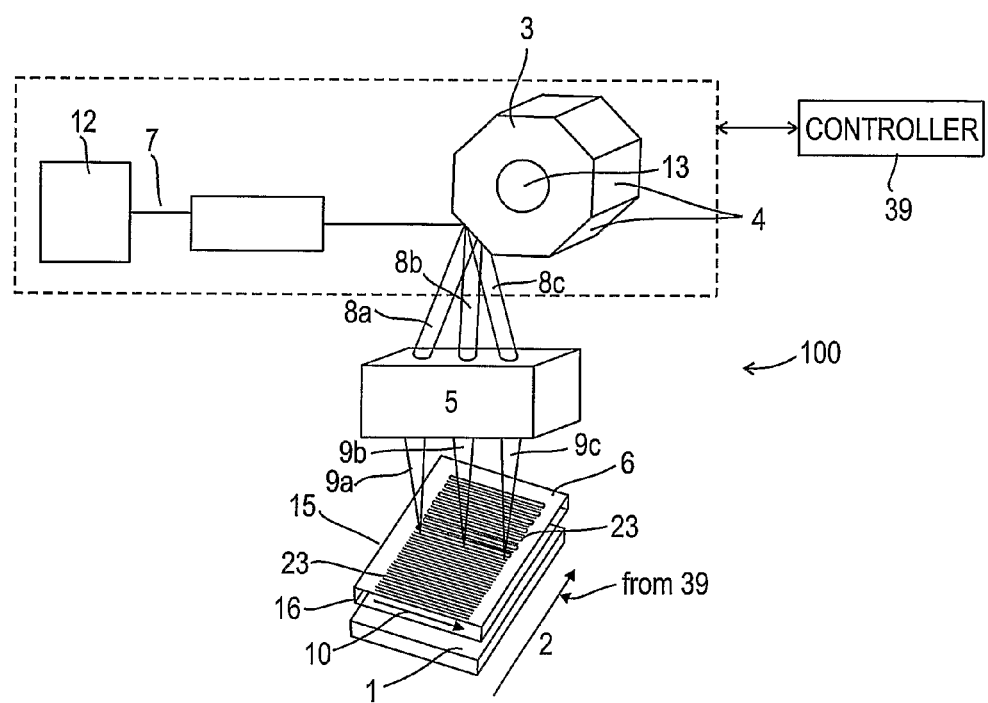
FIG. 1 is a schematic illustration of a scanning system in accordance with an exemplary embodiment of the invention.

The present invention, in some embodiments thereof, relates to an apparatus and method for depositing a coating material, such as a conductor material, from a source substrate onto a receiving substrate, and more particularly, but not exclusively, to depositing a patterned coating material from a source substrate onto a receiving substrate by radiating a light beam to the source substrate, thereby depositing the patterned coating from the source substrate onto the receiving substrate.

An aspect of some embodiments of the invention relates to a source substrate, including a back surface and a front surface, where the back surface carries a patterned coating material, such as a conductor material. In some embodiments of the invention, the patterned coating includes gaps or openings between the coated parts, such that the coating material does not coat the entire back surface of the source substrate. Optionally, the pattern is a non-continuous coating which comprises a plurality of unconnected pieces of coating material. Alternatively, the pattern comprises a continuous strip or area of material which coats less than the entire back surface of the source substrate. Optionally, the coating material coats less than 70%, 50% or 30% of the back surface of the source substrate. In an exemplary embodiment of the invention, the source substrate is transparent and one can see through the source substrate between openings in the coating material.

For the purpose of explanation of the invention, the coating in the following examples is formed as separate lines on the source substrate which are formed as parallel lines or as lines radiating from a point, for example the center of a round source substrate. However, it is noted that the coating can have any other form, such as for example squares, rectangles or spirals. It is further noted that the coating can comprises a single area or a number of unconnected areas.

According to an aspect of some embodiments of the invention, each line of coated material has a height larger then its width. That is, the aspect ratio of the coated lines is approximately equal or greater than 0.1, 0.2 or 1. Optionally, the height of the coated material is between 10 μm-300 μm, for example between 10 μm-150 μm. Optionally, the width of the coated line is between 10 μm-150 μm.

In an exemplary embodiment of the invention, the height of the coated material is more than 3 μm, 4 μm, 5 μm or 7 μm. In an exemplary embodiment, lines with said height and/or aspect ratio are deposited onto the receiving substrate by a single radiation or scan and do not need to be radiated a plurality of times at the same point.

In an exemplary embodiment of the invention, the material is provided as a coating on top of the source substrate. Optionally, the material is provided on protrusions which are formed on the source substrate. Alternatively, the material is provided within trenches in the source substrate. When the material is provided in trenches, more energy is required from the light beam to disconnect the coating material from the source substrate than when it is coated on the surface of the substrate (or on protrusions thereon), as the material in trenches is also required to disconnect from the sidewalls of the trench as well as from the base of the trench. When the material is provided as coating on top of the source substrate, the material has to disconnect only from the surface of the substrate. However, the trenches provide easier and faster filling of the source substrate with the coating material. An additional advantage of trenches is that it is easier to produce a source substrate with a relatively thick coating (e.g. having a height more than 1) and more accurate dimensions when the coating material is provided in trenches.

Therefore, in an exemplary embodiment of the invention, the sidewalls of the trenches are coated with a low adhesion or low surface energy material, in order to reduce adhesion of that the coating material to the sidewalls to ensure that the material is deposited from the source substrate when the back surface of the coating material is released from the source substrate. In an exemplary embodiment of the invention, the back of the trench is coated with a high adhesion material or is textured (e.g. rough) in order to provide good adhesion of the coating material in the trench, preferably eliminating bubbles in the filled trench. A textured surface increases the surface energy of the surface and ensures that the material will be filled in the trench despite the low surface energy material at the sidewalls. Optionally, the trench is formed with a trapezoidal cross-section with the narrow side facing the back of the source substrate. The trapezoidal cross-section assists in depositing the coating material after light radiation, due to the expanding forms at the sides of the trapezoid. In addition, the trapezoid form causes the sidewalls to be radiated by the light as well, even if at lower fluence than the sidewalls. The light radiation will also assist in removing the coating material from the trench.

An aspect of some embodiments of the invention relates to a scanning system including a light source adapted to radiate a light beam through the back surface of the source substrate towards the coating material, thereby to detach the material from the source substrate. In an exemplary embodiment, the material is deposited on a receiving substrate, which is placed below the source substrate and facing the coating material.

In an exemplary embodiment of the invention, each line of coated material is deposited as a whole onto the receiving substrate, without parts of the line being detached from coating material to which it is attached. Optionally, the coating material is detached from the source substrate after being radiated by a single radiation of a light beam or line. The fact that parts of the coating material are not detached from their surrounding coating material assists in reducing cohesion between the coating material and the receiving substrate, as there is no spreading of debris which would otherwise be caused by detaching parts of the coating material from their surrounding material. Furthermore, it will generally require lower power than prior art systems which must selectively detach the coating material from a continuous coating. This allows for the coating material to be thicker than that of the prior art, since only enough energy is needed to detach coating material from the source substrate and not to detach a piece of coating material from a continuous coating.

In some embodiments of the invention, the line of coating material is detached from the substrate starting at one end of the line and detachment proceeds until the entire line is detached, preferably without breaking the line during the detachment. Such detachment may be provided either by high repetition pulse scanning or by radiating the entire coated line with a single beam. In some embodiments, the line is detached and deposited segment-wise. However, since detachment is only from one end for each segment (rather then from three sides) much lower energy/power is required.

In accordance with an exemplary embodiment of the invention, an intermediate layer is provided between the source substrate and the coating material. The intermediate layer optionally has a lower vaporizing temperature than the coating material. The light beam irradiates the intermediate layer which is heated by the light, evaporates thereby creating overpressure and disconnection of the coating material from the source substrate. Due to the low vaporizing temperature of the intermediate layer, the coating material will not heat enough to vaporize or detach from its surrounding coating material.

Optionally, the intermediate layer is transparent to the light beam and absorbs the heat from its heated surroundings. For example, from an opaque part of the source substrate which is positioned beneath the intermediate layer. The intermediate layer may be provided only below the coating material or on the entire back surface of the source substrate, including the openings in the coating material. Due to the transparency of the intermediate layer, the intermediate layer will not influence ablation through said openings.

Optionally, for example when no intermediate layer is provided, the coating material includes vaporizing material such that when a light beam at a relatively low energy is radiated to the coating material, the vaporizing material will evaporate, cause pressure to detach the coating material from the source substrate, while the coating material will keep its form.

In the description below, the light source will be referred to as a laser source. However, it is noted that any other suitable light source, such as for example a flash lamp or other high energy source of non-coherent light can, as for example described herein, be used in accordance with an exemplary embodiment of the invention and such source, if suitable for detaching the conducting material from a coated source substrate is also included in the definition of the term "laser source" and "laser beam".

In an exemplary embodiment of the invention, conductor material should be deposited both on the front surface and on the back surface of the receiving substrate. When the receiving substrate is adapted to be used as a crystalline solar cell, the substrate is generally a bulk type substrate (e.g. p-type) and coated at its front and back surface with an emitter (e.g. n-type). Optionally, the receiving substrate is also coated both at its front and back surface with a passivation layer. The conductor material should be deposited at the front surface onto openings in the passivation layer, contacting the n-type layer. Optionally, the coated material can be positioned on top of the passivation layer at the front surface of the receiving substrate and penetrate therethrough. It is submitted that the conductor material is generally thicker than the passivation layer and will stick out. At the back surface, the conductor material should preferably not contact the n-type silicon and should therefore be deposited into openings through the passivation layer and through the substrate itself, reaching the p-type substrate.

According to an aspect of some embodiments of the invention, the scanning laser is also adapted to ablate (create openings) in the passivation layer and/or receiving substrate onto which the coating material will be deposited.

According to some embodiments of the invention, the scanning laser first ablates a pattern (for example, lines) in the passivation layer and/or receiving substrate and then, using substantially the same setup, the laser irradiates the coated pieces on the source substrate, thereby transferring the coating material from the source substrate to the receiving substrate and filling the ablated pattern of the receiving substrate with the coating material.

In an exemplary embodiment of the invention, the laser source (or sources) is adapted to ablate the receiving substrate and deposit material from the source substrate into the ablated openings in the same set-up or run. According to this embodiment, the laser source radiates two laser beams at substantially the same time. The first radiated laser beam is used for ablating the receiving substrate. The second laser beam is used for radiating the coating on the source substrate to deposit the coating into the created openings shortly after creation of the openings. According to this embodiment, some of the openings in the receiving substrate will be filled with coating material before all the openings are created.

In an exemplary embodiment, the first laser beam will radiate through the transparent source substrate, in the openings between the coating material. Optionally, slits are created in the source substrate through which the first laser beam will radiate. The slits are optionally substantially larger than the ablated openings in order to provide tolerance for inaccuracy of alignment of the laser beam respective to the moving source substrate.

In an exemplary embodiment of the invention, the scanning laser scans in only one direction and the substrates are moved in a cross scan direction. For example, when the laser scans lines, the source and receiving substrates move continuously below the laser beam in a direction substantially perpendicular to the scan lines. Optionally, the scan line is oriented at a small angle relative to the substrates moving axis in order to compensate for movement of the substrate during the laser scanning. The ablation and deposition are periodically repeated to form a plurality of ablated and filled lines in the receiving substrate.

Preferably, the ablated pattern is substantially identical to the pattern of the coating material of the source substrate. The use of the same setup of the laser assists in providing accurate deposition of the material into the ablated pattern. In addition, in some embodiments, the transparent source substrate with the openings between the non-continuous coating material also assists in aligning the source and receiving substrate as one can see through the source substrate to ensure that the coating material is aligned with the openings ablated in the receiving substrate. Alternatively, the pattern of the coating material in the source substrate is narrower or wider than the ablated pattern in the receiving substrate. A wider coating pattern is usually used for the front surface of the receiving substrate where overflow of some material in the margins of the ablated pattern may be tolerated. In the back surface of the receiving substrate, the coated pattern is preferably narrower than the ablated openings such that the deposited material will not contact the sidewalls of the ablated openings and will not contact the n-type layer at the sides. Deficiency can later be fixed by adding another passivation layer in the exposed parts of the passivation openings.

In an exemplary embodiment of the invention, two or more pieces of coating materials are formed from different materials, such that the different coating materials are deposed as different pieces on the receiving substrate. For example, in accordance with an exemplary embodiment of the invention, parallel conductor lines are deposited and busbars are deposited on top of the lines, perpendicular to them. The busbars are formed from a different material.

Optionally, the two or more coating materials are provided on the same source substrate. Optionally the two materials are deposited separately on the receiving substrate, alternatively the two material may be deposed with the same run of the system, for example using different light beams. Alternatively, two or more source substrates are provided having different coatings, and the coating material of the two or more source substrates are deposited on the same receiving substrate.

Optionally, a single laser source is used. Optionally, the single laser source is split into multiple laser beams by a beam splitter or by modulation means. Alternatively, for example when the same system both ablates openings and deposits material in the same run, two or more laser sources are used with a modulation mechanism for modulating the multiple sources. The two or more laser sources can be focused on separate points with a lateral (perpendicular to the lines) and/or vertical (along the lines) shift between them. The multiple laser sources may differ in wavelength, power, spot size, spot shape, timing, etc. In an exemplary embodiment of the invention, the laser beam is radiated to a rotating mirrored polygon to provide raster line scanning. In an exemplary embodiment of the invention, the scanning laser is operated at a relatively low energy. For example, the light source can be operated with a power of 1.5-3 W or at 0.03 J-0.06 J per pulse. The light source can also have different spot sizes.

An aspect of some embodiments of the invention, relates to serial production (by laying down of material and/or ablation of passivation layer) of receiving substrates. In this embodiment, the source substrate is re-filled with coating material after the material is deposited onto the receiving substrate and a new source substrate is produced. In some embodiments, the source is renewed in one portion of the source substrate as the material from another portion is transferred to the receiving substrate.

In accordance with an exemplary embodiment of the invention, the produced receiving substrates serve as solar cells and a solar flat panel may be produced by connecting electrically multiple cells.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

Reference is now made to FIGS. 1-3 of the drawings. FIG. 1 illustrates a scanning system 100 in accordance with an exemplary embodiment of the invention. System 100 includes a laser source 12, a polygon 3 having multiple facets 4 and a scan lens 5. System 100 is controlled by a controller 39 and is adapted to deposit coating material from a source substrate 6 onto a receiving substrate 1. Source substrate 6 is positioned here adjacent to or below lens 5 and receiving substrate is positioned adjacent to or below source substrate 6, substantially parallel to substrate 6.

In an exemplary embodiment of the invention, material should be deposited both front surface and back surface of the receiving substrate. Material is deposited on a surface when the surface is facing the coating material on the source substrate.

The distance between source substrate 6 and receiving substrate 1 is optionally 100 μm or more, for example between 200 μm and 250 μm. The distance is usually less than 300 μm or 400 μm in order to provide accurate deposition of the material. Often the source and receiving substrates are not completely flat and are slightly curved in their planar surface. The relatively large distance between substrates 6 and 1 ensures that the substrates will not touch each other even at the curves of the planar surface of the substrates and makes sure that the substrates do not contact each other.

Figure 2A:
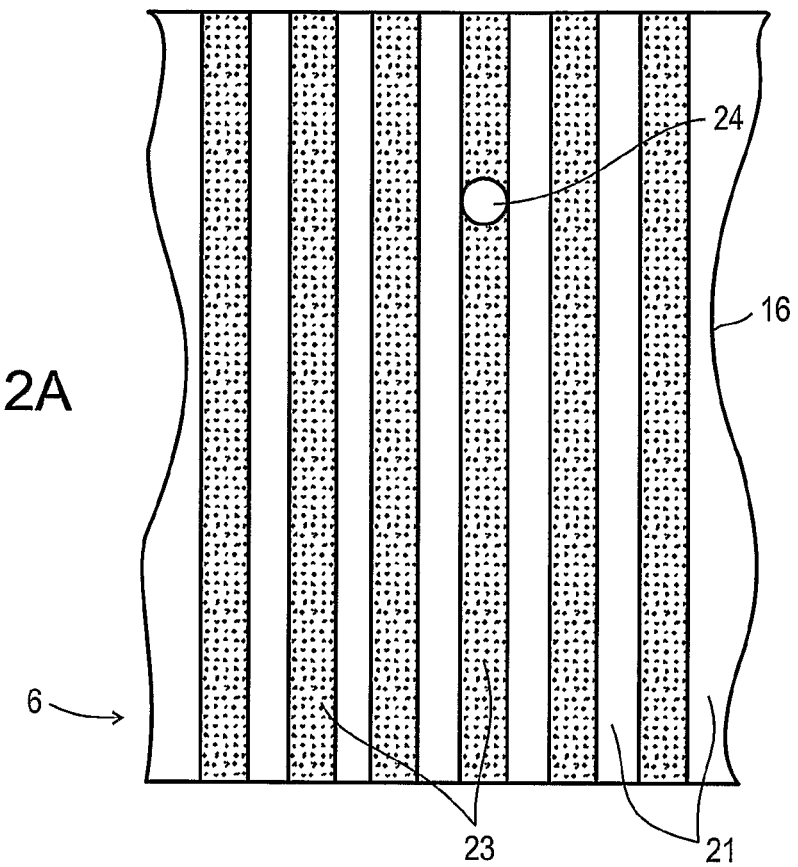
FIGS. 2A-2C are back and side views of a source substrate carrying coating material in accordance with an exemplary embodiment of the invention.
Figure 2B:
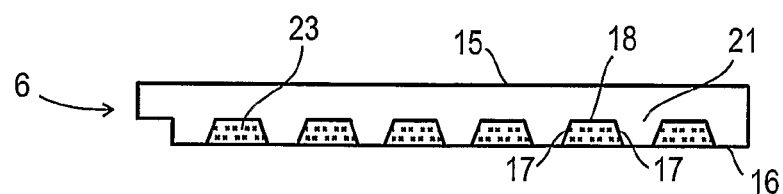
Figure 2C:
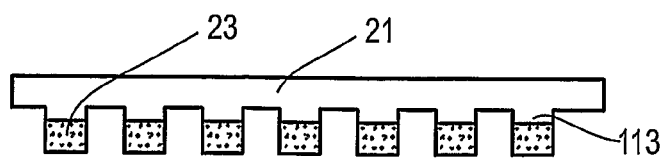

FIGS. 2A-2C are closer views of a source substrate 6 in accordance with an exemplary embodiment of the invention. Substrate 6 comprises a front surface 15 and a back surface 16. FIG. 2A shows a front view of the back surface 16 of substrate 6 which carries a plurality of separate straight lines 23 of coating material intended to be deposited on receiving substrate 1. Optionally, lines 23 are not connected to each other. In an exemplary embodiment of the invention, the lines of coating material have a height of more than 3 μm, 5 μm, 7 μm or 9 μm optionally between 10 μm-300 μm or between 10 μm-150 μm. Optionally, the width of the coated line is between 10 μm-150 μm. In an exemplary embodiment of the invention, the aspect ratio of the coated line is approximately equal or greater than 0.1, 0.2, 0.5 or 1.

Source substrate 6 carries optionally a plurality of coating lines 23. For example, source substrate 6 may carry 100 coating lines having a length of 40-50 μm with a distance of about 1.5 mm between the lines.

Substrate 6 is preferably transparent so that one can see through openings 21 between lines 23. The transparency is advantageous as it can assist in controlling the alignment of the source substrate with respect to the receiving substrate during the scanning process. For example, the transparency assists in positioning the substrates 1 and 6 in scanning system 100 shown in FIG. 1. In addition, the transparency of the source substrate assist in radiating through the substrate as required for ablation and detailed below.

FIGS. 2B and 2C are side views of substrate 6 in accordance with exemplary embodiments of the invention. Optionally, coated lines 23 are provided on top of substrate 6 as shown in FIG. 2C. The coated lines may be provided on optional protrusions 113 of substrate 6 as also shown in FIG. 2C. Alternatively, coated lines 23 are provided within trenches in the back surface of the source substrate as shown in FIG. 2B. Such trenches comprise sidewalls 17 and a bottom surface 18. When the material is provided in trenches, more energy is required from the laser beam to disconnect the coating material as the material is required to disconnect from both sidewalls 17 and surface 18 of the trenches. When the material is provided as coating on top of the source substrate or protrusions thereon, the material has to disconnect only from the back surface of the source substrate.

However, the trenches provide easier filling of the source substrate with the coating material. Therefore, in accordance with an exemplary embodiment of the invention, sidewalls 17 of the trenches are coated with a low adhesion or low surface energy material, in order to ensure that the coating material will not adhere to the surfaces. Due to the low surface energy at sidewalls 17, care should be taken that the coating material will adhere to the bottom surface 18 when filled and to eliminate bubbles in the material when filled. Optionally, bottom surface 18 of the trenches will be coated (or made from) a high surface energy material. This will ensure that the coating material is stably positioned in the trenches and will be deposited from the source substrate when the coating material is released from the bottom surface of the trench, without adhering to the sidewalls of the trench. Alternatively or additionally, bottom surface 18 is textured, optionally providing a rough texture, to provide high surface energy and good adhesion of the coating material to bottom surface 18 and in order to eliminate bubbles in the material when filled in the trenches.

An additional advantage of the trenches is that it is easier to produce source substrate with a relatively thick coating (e.g. more than 5 μm) within trenches than on top of a flat substrate.

Optionally, the trenches are formed as a coating layer on top of the back surface of the source substrate (not shown) wherein openings are created in the form of the trenches. The layer is preferably made of a low surface energy material, for example a metal such as nickel. The nickel layer may have a thickness of for example 100 μm or any other thickness desired for the coated conductive material.

In accordance with an exemplary embodiment of the invention, the trenches have a trapezoidal cross-section, as shown in FIG. 2B. The trapezoidal cross-section causes easier removal of the coating material when radiated, due to its broadening form on the sides. In addition, the trapezoid form will cause some radiation at sidewalls 17, even if at lower fluence than at the bottom surface 18. This low fluence will also assist in removing the material from the sidewalls. It should be noted that due to the trapezoidal cross section, the broad base of the trapezoid which is facing back surface 16 will cover a relatively large area of the receiving substrate and will cause shading. While a relatively small total cross section of the material, which is influenced also by the narrow side of the trapezoid, facing bottom surface 18 of the trench, will provide a relatively low conductivity. Therefore, the trapezoid should be formed as similar to rectangle as possible in order not to harm the conductivity of the material deposited on the receiving substrate.

In some embodiments of the invention, an intermediate layer is provided between substrate 6 and coating material 23. Optionally, the intermediate layer is high volatile and will evaporate at energy which is low relative to the evaporation of coating material 23. This will cause the intermediate layer to evaporate and cause pressure at bottom surface 18 and detachment of material 23 from the source substrate. Due to the relatively low energy used, material 23 will not evaporate and keep its form when deposited onto receiving substrate 1 such that coating lines 23 will be deposited as a whole onto the receiving substrate.

Optionally, the intermediate layer is transparent to the radiation light and will absorb heat from its heated surroundings, such as coating material 23. The transparency of the intermediate layer assists in alignment of the substrates.

For example, in an exemplary embodiment of the invention, alcohol, such as methanol or ethanol, is provided as an intermediate layer between the source substrate and the coating material. Alcohol is transparent to laser radiation, however, the laser radiation heats the material surrounding the alcohol, thereby heating the alcohol. Alcohol has a relatively low evaporation temperature (e.g. about 78° C. for ethanol). Accordingly, the alcohol will evaporate while the coating material will keep its form. The evaporation of the alcohol causes overpressure at the back surface of the source substrate (or trench) and causes the coating material to be deposited as a whole.

Optionally, the intermediate layer is provided only below the coating material. Alternatively, the entire source substrate is coated with the intermediate layer.

In an exemplary embodiment of the invention, the portion of the source substrate below the intermediate layer, for example bottom surface 18 of the trenches, are formed of an opaque material of about 1 μm. This is preferable for example when the coating material is also transparent to the radiated light. The opaque layer will absorb the heat and thereby heat the intermediate layer and cause evaporation thereof.

Alternatively, when no intermediate layer is used, the coating material includes a low energy evaporating material to provide a similar effect of evaporation of the low energy vaporizing material while leaving the coating material stable when heated at low energy.

The coating material may be any coating material known in the art. For example, silver based metallic paste. Generally, metallic paste used for solar applications is a composition of four different materials: metal powders, glass frits and modifiers, volatile solvent and non-volatile polymer or resin.

Figure 3A:
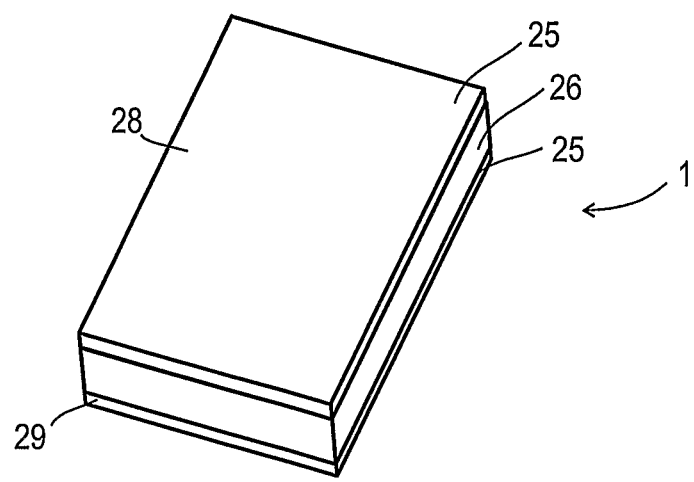
FIGS. 3A and 3B are schematic illustrations of a receiving substrate in accordance with an exemplary embodiment of the invention.

FIG. 3A is a schematic illustration of a receiving substrate 1 in accordance with an exemplary embodiment of the invention. Receiving substrate 1, which is preferably a silicon wafer, comprises an inner layer 26, a front surface 28 and a back surface 29. Optionally, for example when substrate 1 is adapted to serve as a crystalline solar cell (for example forming a diode near its front surface), inner layer 26 is a bulk substrate (e.g. p-type silicon) and coated at its front and back surface with an emitter (e.g. n-type layer). Optionally, the receiving substrate is also coated both at its front and back surface with a passivation layer 25.

The coating material should preferably be inserted through the passivation layer in the front surface, such that the coating material will contact the n-type layer. There are two options known in the art therefore. A first option known in the art is depositing the coating material on top of the passivation layer and causing the coating material to penetrate therethrough. For this purpose, the coating material should preferably contain glass frits which cause penetration of the coating material through the passivation layer when the substrate is heated. The glass frits also improve adhesion of the coating material to a silicon receiving substrate.

Figure 3B:
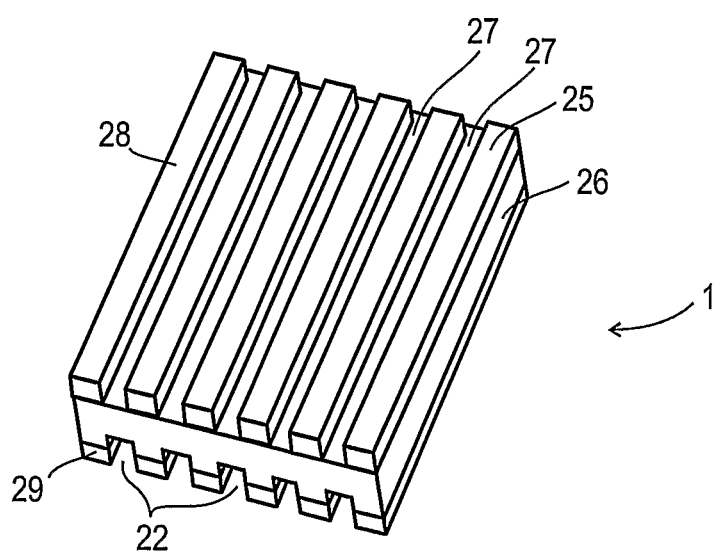

A second option is illustrated in FIG. 3B. Openings 27 are created in the passivation layer at front surface 28 wherein the coating material will be deposited. Openings 27 are made in the passivation layer and the material deposited in openings 27 will contact the n-type layer. At back surface 29, the coating material should preferably be deposited in openings 22 which are substantially deeper than openings 27 and are made through passivation layer 25 and through inner surface 26, passing the n-type layer such that the material deposited in openings 22 will contact the p-type substrate. For example, in an exemplary embodiment, openings 27 have a depth of approximately 85 nm, while openings 22 have a depth of between 1-1.5 μm, when the n-type layer has a thickness of about 300-500 nm.

The creation of openings 22 and 27 in the receiving substrate requires alignment of the deposition material which should be deposited substantially only on openings 27. The source substrate of the present invention assists in providing accurate alignment since the substrate is preferably transparent and one can see through the openings in the coating material in order to position openings 22 and 27 underneath coating lines 23. It is noted that, after the lines are deposited, the coating material will protrude from the openings since the openings are optionally less deep than the thickness of the deposited coating material. In addition, the coating material deposited on openings 27 on front surface 28 of the receiving substrate is preferably wider than the openings, and the material will overlay the edges of the openings, sealing the openings and protecting the p-n junctions. Coating material deposited on openings 22 on back surface 22 of the receiving substrate is preferably narrower than the openings such that the coating material will not contact the n-type layer at the sidewalls of openings 22. The gaps remaining in openings 22 can optionally be filled with passivation material.

The design of exemplary receiving substrates (or wafer) is described in detail in Israeli application no. 194665 filed on Oct. 12, 2008 and Israeli application no. 198629 filed on May 7, 2009 which are incorporated herein by reference.

Openings 22 and 27 could be created by any method known in the art such as for example laser or mechanical ablation or by etching technology. Optionally, when the coating material is inserted onto openings 27, the coating material could be free of glass frits, which is usually required for penetration through the passivation layer. The lack of glass frits allows heating of the receiving substrate with the coating material deposited thereon above 835° C. in order to improve adhesion between the substrate and the coating material. An example of a glass frits free conductive paste is P/N 146A or PV167 manufactured by DuPont.

Referring back to FIG. 1, controller 39 controls laser source 12 to radiate a laser beam 7 towards polygon 3. Polygon 3 rotates around its axis 13 and the polygon facets 4 deflect laser beam to different angles relative to lens 5, thereby scanning laser beam 7 in a plurality of directions, e.g. 8a, 8b and 8c, which are directed towards lens 5 and are transferred to different laser beams 9a, 9b and 9c. During rotation of polygon 3, laser beams 9a, 9b and 9c provide a linear scanning line in a direction 10 which is irradiated towards front surface 15 of source substrate 6, along a line of coating material thereby depositing a coating line 23 from source substrate 6 onto receiving substrate 1. Optionally, a line of coating material is deposited after been irradiated once. Contrary to the prior art where coating material having a relatively large thickness (e.g. more than 5 μm) is irradiated more than once, when each irradiation deposits a thin layer of the coating material, in some embodiments of the invention, the coating material is deposited after one radiation, without requiring a plurality of radiations at a single point of the coating material.

Controller 39 preferably controls the rotation velocity of polygon 3 and the power of laser source 12 such that coating line 23 is deposited as a whole, without being cut into pieces. Preferably, the rotation velocity of the polygon is stable and the controller (or other means known in the art) controls the velocity movement of the substrates.

When the laser beam radiates source substrate 6, the laser beam passes through the transparent layer and is absorbed by coating material 23 (or by the intermediate layer between substrate 6 and coating material 23), the laser beam radiating the material is shown as spot 24 in FIG. 2A. This causes volatilization of solvent in the coating 23, creating a gas pressure at the interface between the source substrate back surface and the coating material. The coating material will release from the source substrate and be transferred to receiving substrate 1 which is positioned below the source substrate.

In an exemplary embodiment of the invention, a sensor (not shown) is provided on source substrate 6. The sensor is in communication with controller 39 and provides the controller with the exact position and alignment of the source substrate. The controller will ensure that the laser beam will radiate at the coating material so that the coating material will be deposed on the receiving substrate. In addition, controller 39 may control the movement and direction of receiving substrate to ensure that the coating material will be deposited in the required positions.

In addition, receiving substrate 1 should be aligned with source substrate 6 such that the material will be deposited in the desired location. It is noted that when the material is not required to be deposited into openings in the receiving substrate, the alignment can be less accurate. The coating material is generally positioned at a distance from the border of the substrate, for example 0.2 mm, 0.5 mm or 1 mm away from the border, therefore, the alignment of the receiving substrate can tolerate inaccuracy of about 0.2 mm or 0.5 mm without damaging the operability of the produced receiving substrate. In addition, the distance between the deposited coating lines is also not required to be accurate for operability of the produced receiving substrate.

The alignment is preferably performed by controller 39 who optionally receives input from the laser source and from the substrates to know their positions. Optionally, the position and/or alignment of the substrates may be coordinated using optics which may depend on markings on the substrates to optically align the substrates. The transparency of substrate 6 assists in aligning the substrates as one can see through the openings of the coated pattern.

In the embodiment shown in FIG. 1, openings 22 and/or 27 in the receiving substrate are optionally formed before deposition of the coating material from the source substrate. Alternatively, openings 22 and/or 27 are also created with scanning system 100 and substantially the same setup of the laser is used, which also assists in proper alignment of the coating material in the openings. The coated pattern of the source substrate should preferably be substantially identical to the patterned ablation in the passivation layer of the receiving substrate.

As used herein, the term "set-up" refers to the configuration of the scanning system during processing of a receiving substrate. During processing of a substrate, the size of the laser spot and/or the power at which is operated and/or the focal plane of the spot may optionally change. As the term is used herein, such change does not constitute a change in set-up.

As used herein, the term "substantially identical pattern" refers to patterns which have substantially the same shape. The pattern features on the receiving substrate may differ by less than 10% in width from those on the source substrate, as detailed with reference to FIG. 3 above. Optionally the coated lines are wider than the openings in the passivation layer, this can cause overlay of coating material over the openings on the passivation layer. Alternatively, the coated lines are narrower than the openings in the passivation layer. If this is the case, the receiving substrate is optionally refilled with passivation material in the unfilled gaps. In addition, the coated lines are usually thicker than the deepness of the ablated openings, such that the coated lines will protrude from the openings.

The embodiment of FIG. 1 can also be used without openings in the passivation layer, for example using coating material which will penetrate through the passivation layer, as is known in the prior art.

After deposition of a coating line, source substrate 6 and receiving substrate 1 are moved in a direction indicated as arrow 2 in FIG. 1, so that a next coated line 23 can be deposited on receiving substrate 1. Arrow 2 is preferably substantially perpendicular to direction 10 of the laser line. This provides sequential scanning of the substrate to deposit a series of lines. Controller 39 optionally moves the substrates according to inputs received from the substrates and/or the laser source. The substrates may slightly angle from the direction of arrow 2 in order to compensate of the movement of the substrate during scanning. For the same reason, controller 39 may optionally move the two substrates 6 and 1 in slightly different directions in order for the lines to be parallel one to each other, when the motion is taken into account.

It is noted that due to the fact that the lines of coating material 23 are deposited as a whole, relatively low power of the laser beam could suffice for releasing the coating material from the source substrate. Since the coating material is to be released at from the source substrate only and does not need to be detached from a continuous piece of coating material as in the prior art, a relatively small amount of heat could suffice for the deposition. Accordingly, the coated lines can have a height of more than 3 µm or more than 5 µm. This would be difficult in the prior art as the greater the height of the coating material, more energy would be needed for detaching it from its surrounding coating material. In addition, for the same reason, the lines of the present invention can have an aspect ratio substantially equal or greater than 0.1, 0.2 or 1. For example, in accordance with the present invention, for coating lines having a height of 100 µm and a pulse fluence of 200-400 mJ/cm$^2$, the laser source can be operated with an average power of 1.5-3 W, for line widths of between 50-100 µn.

In addition, due to the low energy required, the light source could be a non-laser (non-coherent) light, such as for example broadband flash lights, light emitting diode (LED) or others. It is to be understood that even if the line were segmented during deposition, this would still require less energy (and allow for thicker coatings) than the prior art, since each segment would have to be detached on only one side rather than on three sides as in the prior art.

Optionally, the radiated laser is a pulse laser such as TruMicro 5250 available from TRUMPF, operating at a wavelength of 515 nm and has a pulse duration of less than 10 ps with a maximum energy of 125 µJ or TruMicro 5350 also available from TRUMPF, operating at a wavelength of 343 nm and has a pulse duration of less than 10 ps with a maximum energy of above 75 µJ. These pulse lasers provide a combination of high energy density, short pulse duration and UV spectral range yields which are efficient in depositing a large variety of materials. This laser could be also used for ablating openings in the passivation layer.

Alternatively, the radiated laser is a continuous (CW) laser, such as for example Verdi 12 available from Coherent Inc, which provides continuous radiation power of 12 W at a wavelength of 532 nm. Optionally, a laser diode could be used. It should be noted that in cases where low energy is required from a continuous laser, the laser source may be replaced by a non-laser light source, such as for example light emitting diode (LED), flash lamps or others.

Polygon 3 could be for example HSSP-100 by Kugler GmBh having 6 to 36 facets and a maximum speed of 25,000 rpm.

Lens 5 is preferably an F-Theta lens which converts polygon rotation into line scanning. Alternatively or additionally, lens 5 includes a telecentric lens in order to achieve a vertical laser beam radiation on the source substrate having a constant angle along the scan line. For example, lens 5 could be a telecentric F-Theta lens 4401-461-000-21PG, optimized for a wavelength of 532 nm, available from LINOS Photonics GmbH.

Optionally, an acousto-optic deflector 11 is added in the laser path between laser source 12 and polygon 3. Acousto-optic deflector 11 assists in keeping laser beam 7 on facet 4 of polygon 3 during rotation of the polygon. An exemplary deflector that could be used in accordance with an exemplary embodiment of the invention is DTSX-250 available from AA Opto-Electronic Company, which enables deflection angle of up to 3 degrees in a wide spectral range—from UV to IR.

Figure 9A:
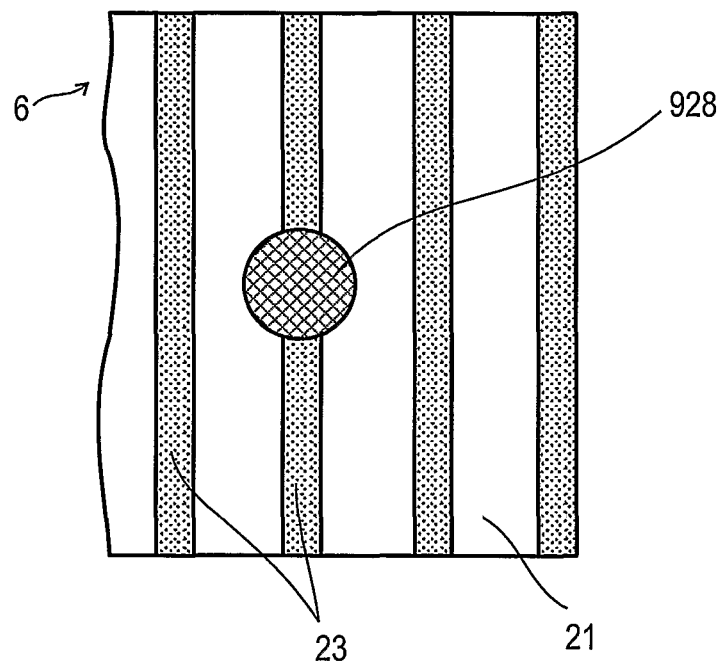
FIGS. 9A-9D are schematic illustrations of source substrates, carrying different coatings and laser spots radiated thereon in accordance with exemplary embodiments of the invention.

In accordance with another exemplary embodiment of the invention, the laser spot can be substantially bigger than the width of coating line 23. For example, a laser spot 928 shown in FIG. 9A. With a wide laser spot, the alignment of the laser with the coating lines can be less accurate. Thus, the pattern of the deposited material is mainly defined by the coated pattern and less by the alignment of the laser. In addition, the heat diffusion on the coating material is reduced thereby enabling easier disconnection of the coating material from the source substrate. The relatively large laser spot further assist in reducing cohesion of the coating material with the source substrate since the laser beam irradiates all surroundings of the coating line and will therefore heat the side of the trough in which the material is deposited.

Preferably, with this embodiment, the diameter of laser spot 928 is smaller than the distance between two coating lines 23 such that the laser spot will not radiate more than one coating line 23 at a time.

Figure 9B:
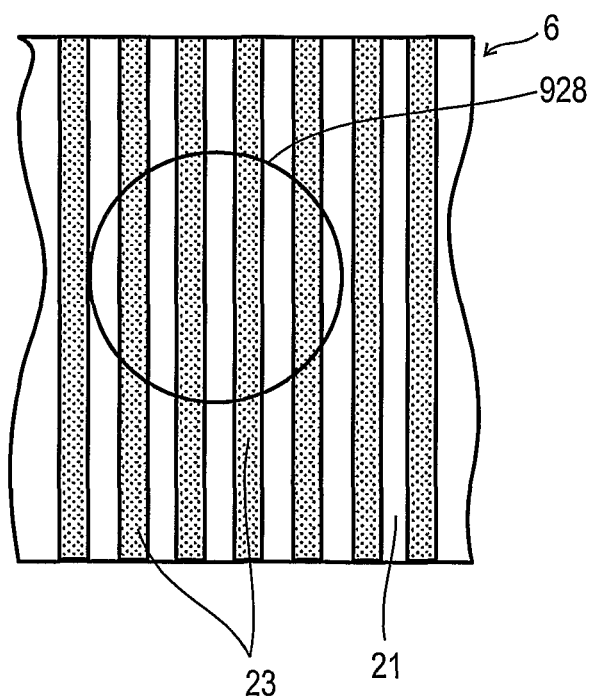
Figure 9C:
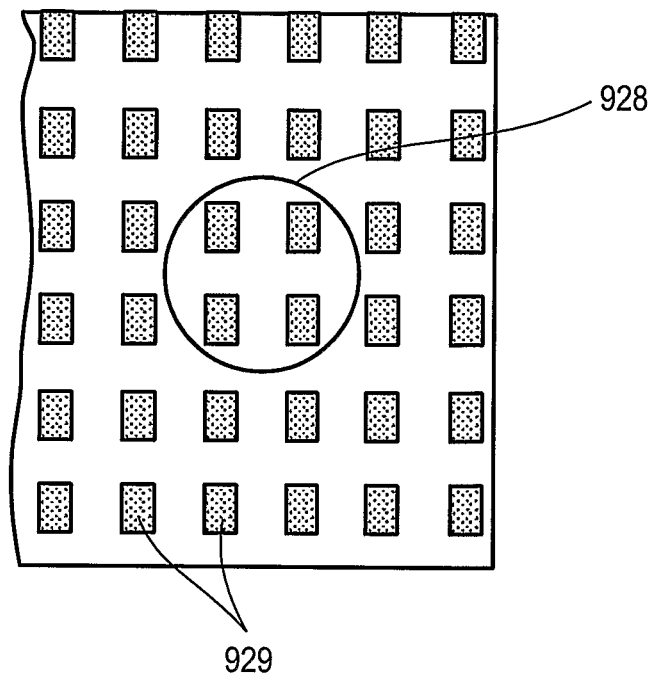

Alternatively, in accordance with another embodiment of the invention, the laser spot is large enough to radiate a number of separate pieces of the coated pattern at the same time. FIG. 9B illustrates a source substrate 6 carrying a plurality of unconnected coated lines and a laser spot 928 radiating more than one coating line 23 at the same time, for example 4 coated lines. Another exemplary coating is shown in FIG. 9C where source substrate 6 carries a plurality of coating rectangles 929 and laser spot 928 radiates a plurality of such rectangles at the same time.

Figure 9D:
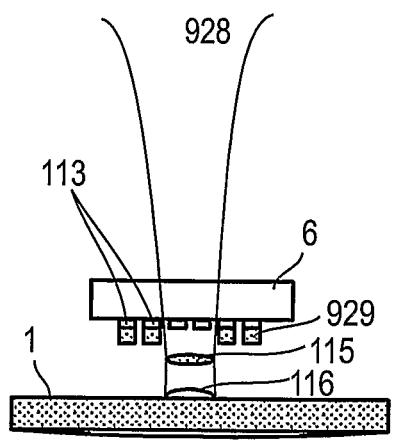

The plurality of coating pieces radiated at the same time will release at the same time from the source substrate. If the receiving substrate is far enough from the source substrate, the released coating pieces will merge into one coating piece before deposition on the receiving substrate, as illustrated in FIG. 9D. Alternatively, the released coating pieces can be heated to make them coalesce. Laser beam 928 is directed towards source substrate 6 and radiates a plurality of coated pieces 929 which disconnect and merge into one coating piece 115.

When the laser power is strong enough, beam 928 will radiate receiving substrate 1 (through the openings between the coated pieces of the source substrate, before coalescing the pieces) and optionally ablate trough a portion 116 thereon. Thus, in the embodiment shown in FIG. 9D, the same laser beam will both ablate openings in the receiving substrate and deposit material therein. Optionally, as also shown in FIG. 9D, source substrate 6 has protrusions 113 on which the coating material is positioned.

Figure 4:
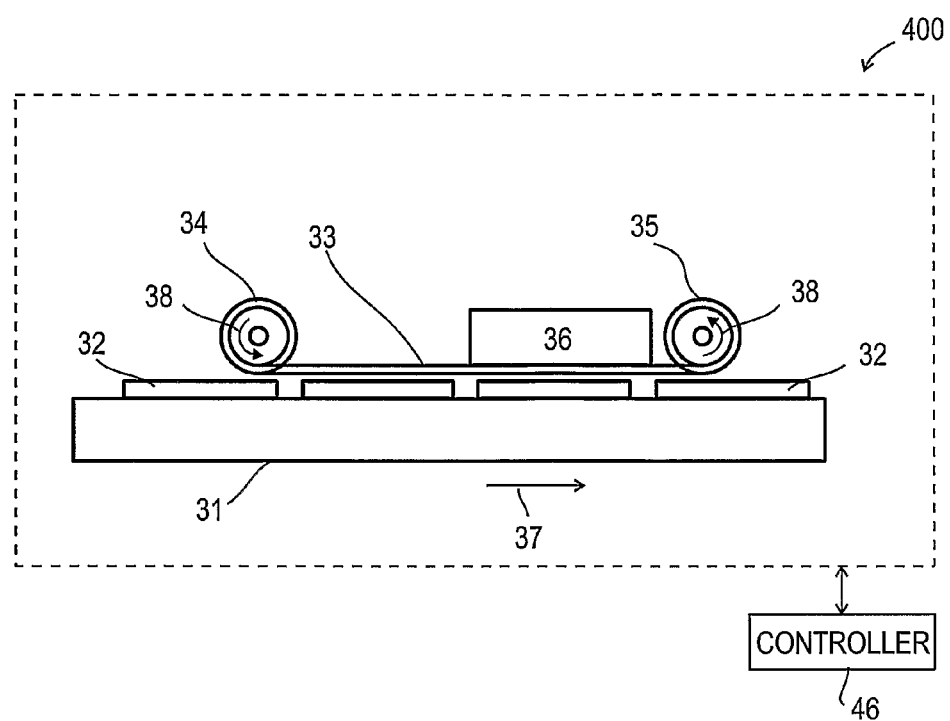
FIG. 4 is a schematic illustration of a scanning system in accordance with another exemplary embodiment of the invention.

FIG. 4 is a schematic illustration of a scan system 400 for serial production of receiving substrates in accordance with another exemplary embodiment of the invention. Scan system 400 consists of a conveyor with two rollers 34 and 35 which rotate in a direction marked by arrows 38. The conveyor carries a flexible source substrate 33 with coating material thereon. Source substrate is unrolled from wheel 34 and is rolled on to wheel 35. A series of receiving substrates 32 is positioned on a tray 31 which is moving in a direction indicated by arrow 37. In this embodiment, the source substrate is longer than each of the receiving substrates, actually longer than a plurality of substrates.

Source substrate 33 is positioned such that the surface carrying the coating material faces receiving substrates 32. System 400 further comprises a scanning laser system 36 for radiating a laser beam to source substrate 33 and to the coating material thereon, thereby depositing the coating material onto receiving substrates 32, using one of the methodologies described above, for example. Laser system 36 preferably radiates scan lines perpendicular to direction 37 for depositing an entire coating line without breaking it Laser system 36 could be, for example, the laser system shown in FIG. 1. The velocity of movement of wheels 34, 35 and tray 31 are coordinated by a controller 46 such that the coating material will be radiated by the laser line and each coating line of source substrate 33 will be deposited on the desired position in receiving substrates 32. The serial production will terminate when the source substrate is transferred on to roller 35.

Since source substrate is continuous and gaps exist between receiving substrates 32, controller 46 should preferably stop the laser scanning when the coating material is positioned in the gaps. Controller 46 optionally knows the positions of source substrate 33 and receiving substrates 32 by sensors provided on the substrates or conveyor, optics or by any other means known in the art.

Figure 5A:
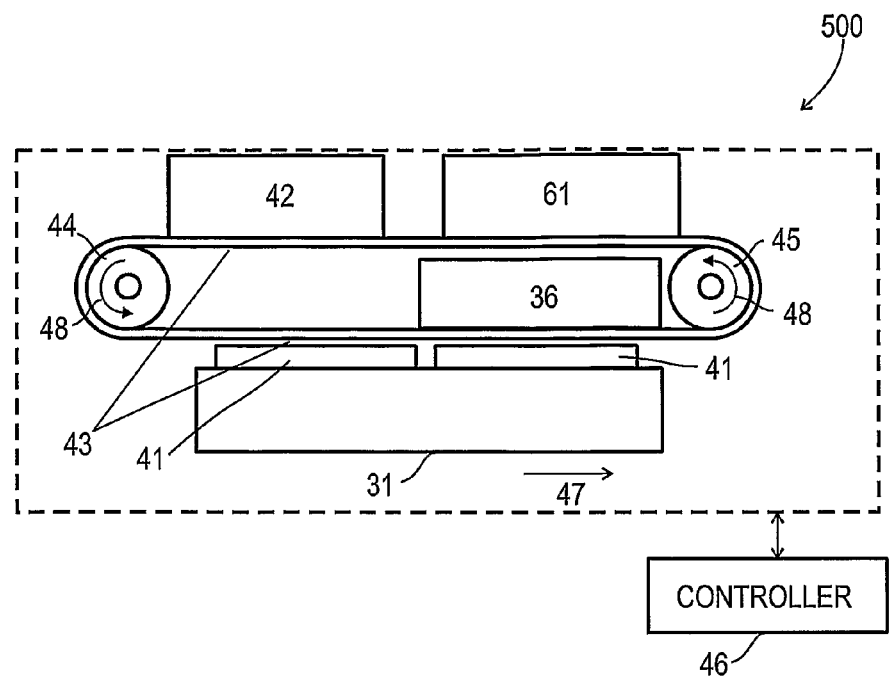
FIGS. 5A-5D are schematic illustrations of scanning systems for serial production of receiving substrates in accordance with exemplary embodiments of the invention.

Another exemplary scanning system 500 for serial production of receiving substrates is shown in FIG. 5A. A conveyor including two rollers 44 and 45 is shown. The conveyor carries a flexible source substrate 43. Source substrate 43 is not rolled on the rollers as shown in FIG. 4 but is an endless belt with rollers 44 and 45 inside it such that as rollers 44, 45 rotate in a direction 48, substrate 43 is driven in the same direction 48. System 500 further comprises a tray 31 carrying receiving substrates 41. Tray 31 moves in a direction indicated by arrow 47. A scanning laser system 36, similar to the one shown in FIG. 4 is used. The velocity of movement of rollers 34, 35 and tray 31 are controlled by a controller 46 and are coordinated such that each coating line of source substrate 33 will be deposited on the desired position in receiving substrates 32. The substrates may be coordinated similar to the coordination described with respect to FIG. 4, such as using optics which may depend on markings on the substrate to optically align the substrates. Controller 46 optionally also controls the power of the laser source in laser system 36.

System 500 further comprises a filling station 42 for filling source substrate 43 with coating material. The coating material is optionally based on a silver composition, such as for example PV 143 of Solarnet™ available from DuPont Microcircuit Materials. Preferably, for coating lines with a high aspect ratio, a metallic deposition having a viscosity in the range of $10^4$ cP to $10^7$ cP should be used.

Source substrate 43 preferably comprises trenches at which the coating material is filled. This simplifies the filling process by filling station 42 and enables a faster production of receiving substrates. In an exemplary embodiment, filling station 42 fills the trenches with material and then wipes the residues, sticking out of the trench with a squeegee.

The position of filling station 42 in FIG. 5A is exemplary only, the filling station could be positioned anywhere around source substrate 43. Since the coating material generally has a high viscosity, the filling station could also be positioned below the trenches as the coating material will not drip even when facing down. The material can for example have a viscosity of between $10^4$ cP and $10^6$ cP.

An additional optional spreading station (not shown) for spreading an intermediate layer between the source material and the coating material may be provided. The laying station can be positioned before filling station 42 and optionally spreads an intermediate layer on the source substrate, with for example a brush. The intermediate layer is preferably a low volatizing material which assists in depositing of the coating material at a low energy.

System 500 further includes an optional cleaning station 61 for cleaning source substrate 43. Optionally, source substrate 43 is cleaned before it is re-filled with coating material to ensure that no residues of coating material are left on source substrate 43 before it is refilled such that the filled coating will be uniform and will remain stable when deposited on the receiving substrate. Alternatively or additionally, source substrate 43 is cleaned after refilling to remove residues of the filling on the transparent substrate and/or to remove the intermediate layer from the source substrate on portions where no coating material was filled. Optionally, when the source substrates includes slits, cleaning station 61 produces air pressure to clean the slits from any coating material which may have been filled therein by filling station 42.

Filling station 42 and cleaning station 61 are optionally also controlled by controller 46.

Figure 5B:
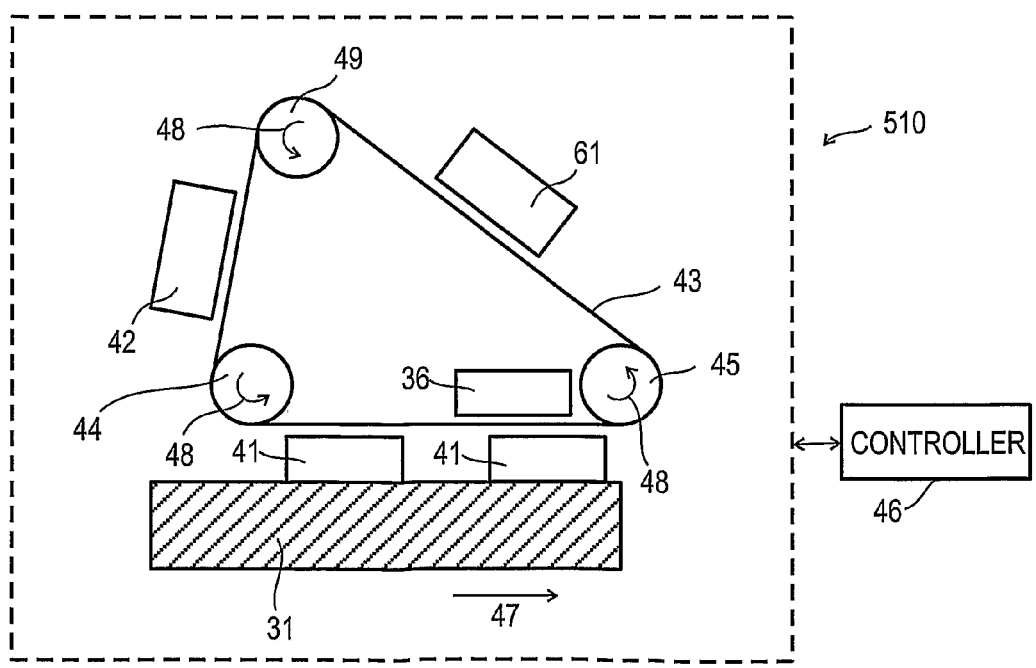
Figure 5C:
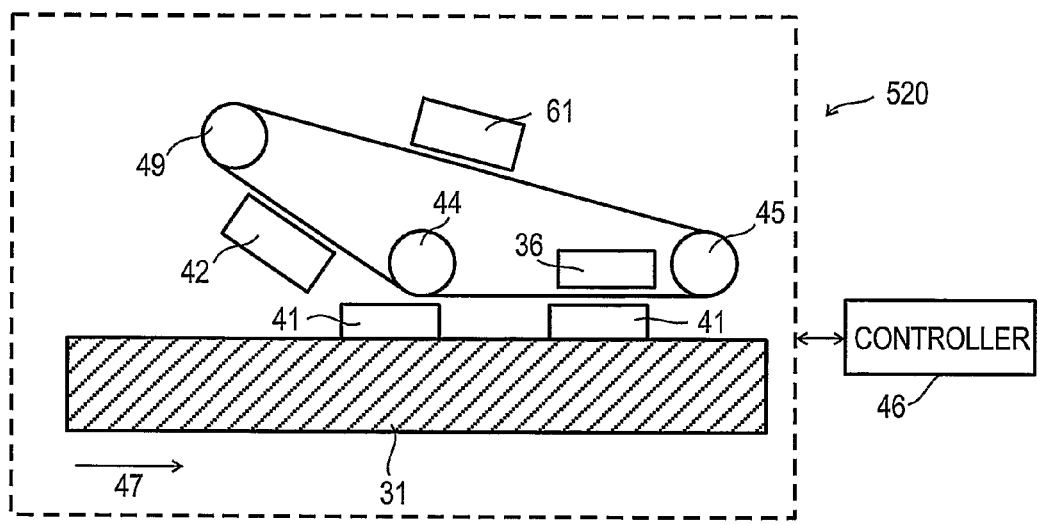

Alternative embodiments of scanning systems are shown in FIGS. 5B and 5C. FIG. 5B illustrates a scanning system 510 which includes a third roller 49 in addition to rollers 44 and 45 such that the belt carrying source substrate 43 is triangular. Filling station 42 is positioned on a vertical portion of the belt and cleaning station 62 is positioned on an angled portion of the belt carrying source substrate 43. FIG. 5C illustrates a scanning system 520 similar to that shown in FIG. 5B, wherein filling station 42 and cleaning station 62 are both positioned on an angled portion of the belt carrying source substrate 43.

Figure 5D:
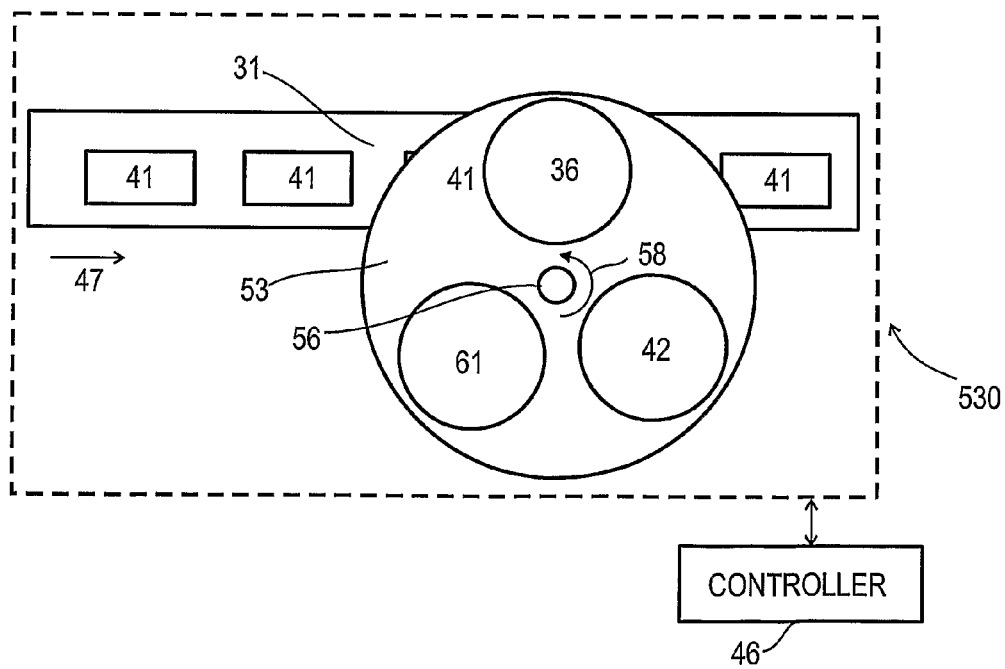

FIG. 5D is a schematic illustration of a scanning system 530 for serial production of receiving substrates in accordance with yet another exemplary embodiment of the invention. In system 530 the source substrate can be (and preferably is) a rigid substrate and does not have to be flexible as in systems 400, 500, 510 and 520 described above.

System 530 includes tray 31 with a plurality of receiving substrates 41. System 530 further includes a source substrate 53 having an axis 56. Source substrate 53 can be formed as shown for example in FIG. 6 (described in more detail below). There is further provided a laser system 36 for depositing the coating material from source substrate 53 to receiving substrate 41. Optional filling station 42 and optional cleaning station 61 are also provided in system 530. The filling and cleaning stations are substantially similar to the stations shown and detailed with respect to FIG. 5A. In addition, a laying station for brushing an intermediate layer can be provided as described with respect to FIG. 5A above.

Tray 31 with receiving substrates 41 move in a direction indicated by arrow 47. Source substrate 53 moves in a direction indicated by arrow 58. Laser system 36, filling station 42 and cleaning station 61 do not rotate with substrate 53 but stay in place. Laser system 36 is adapted to radiate scan lines for depositing lines of coating material from source substrate 53 to a receiving substrate 41, similar to the laser system shown in FIG. 1 or the laser system shown in FIG. 7 which is described and detailed below. Scanning system 530 is controlled by controller 46.

Figure 6:
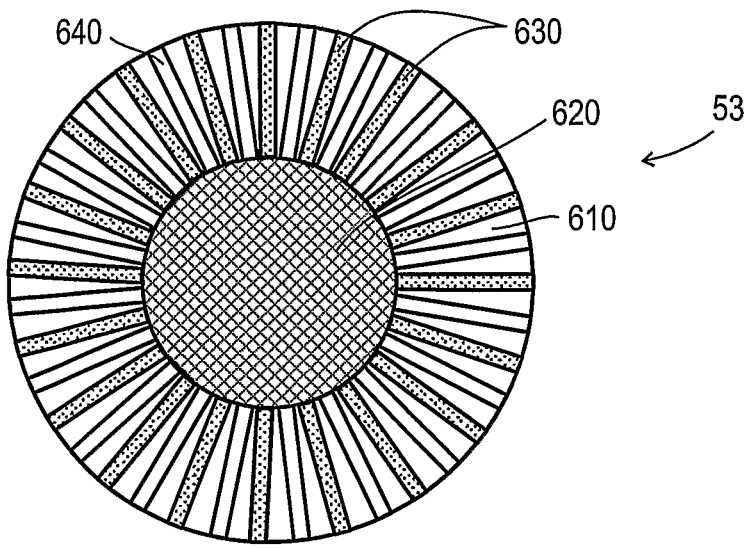
FIG. 6 is a schematic illustration of a source substrate in accordance with yet another exemplary embodiment of the invention.

FIG. 6 is a schematic illustration of a source substrate 53 in accordance with an exemplary embodiment of the invention. Source substrate 53 has a circular shape 610 and an axis 620. Substrate 53 is preferably transparent and carries coating lines 630. Source substrate 53 is adapted to rotate around its axis and could be used in scanning system 530 of FIG. 5D and scanning system 700 shown in FIG. 7.

Source substrate 53 also includes optional slits 640 between the coated lines 630. Slits are adapted to provide a space for a laser beam to pass through the source substrate and ablate openings in a passivation layer of a receiving substrate which is positioned below the source substrate, as for example in scanning system 700 of FIG. 7. Slits 640 are preferably used since the substrate 53, even if transparent, may be stained due to spreading of coating material from the filling station.

In an exemplary embodiment, slits 640 are substantially wider than the openings created in the passivation layer (and the coated lines 630), in order to compensate for inaccuracy of alignment of the laser beam within the slit. In addition, slits 640 may assist in aligning the substrates, as one can see through the slits when source substrate is not transparent.

Alternatively, no slits are provided and a laser beam can be radiated through the gaps between coating lines 630, through circular shape 610. Since circular shape 610 is preferably transparent, shape 610 should not disturb the radiation therethrough.

Figure 7:
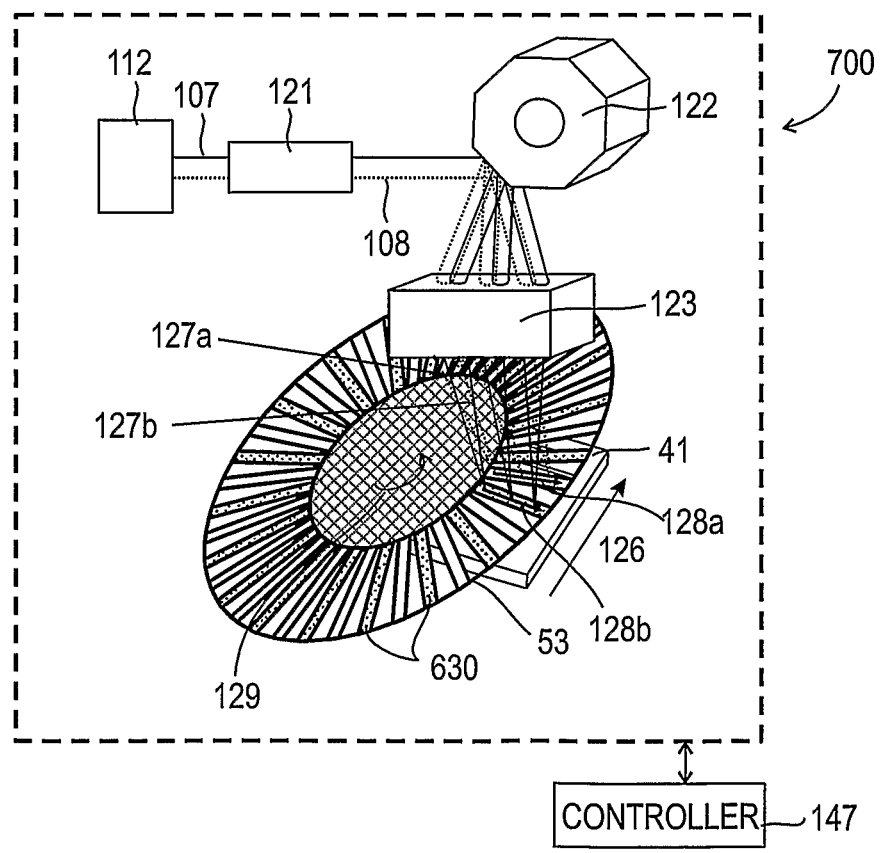
FIG. 7 is a schematic illustration of a scanning system used with the source substrate shown in FIG. 6.

FIG. 7 is a schematic illustration of a scanning system 700 wherein ablation of the passivation layer of the receiving substrate and deposition of the coating material from the source substrate onto the receiving substrate are performed with the same system. System 700 includes a laser source 112, a polygon 122, a lens 123 and an optional acousto-optic deflector 121 similar to the ones shown in FIG. 1. However, laser source 112 of system 700 comprises two laser sources which radiate two laser beams 107 and 108 which eventually transform into two parallel laser lines 127a and 127b. Laser lines 127a and 127b are optionally radiated at substantially the same time and have the same direction.

A controller 147 is provided for controlling the operation of scanning system 700. Controller 147 controls laser source 112 and polygon 122 such that laser line 127a forms a scan line 128a through slits 640 of source substrate 53 and radiate receiving substrate 41, thereby ablating an opening in the receiving substrate. Controller 147 further controls laser source 112 and polygon 122 such that laser line 127b forms a scan line 128b which is absorbed by a coating line 630 of the source substrate and causes its deposition onto the created opening in the receiving substrate.

Receiving substrate 41 is moved by controller 147 in a direction 126 which is substantially perpendicular to the scan lines and source substrate 600. Source substrate 53 is controlled by controller 147 to rotate around its axis in a direction 129 which causes the coating lines 630 to be substantially perpendicular to the scan lines when irradiated. The movement of receiving substrate 125 and source substrate 630 is preferably coordinated with the radiation of the laser beams by controller 147 so that each coated line 630 is deposited in an opening created in the passivation layer of receiving substrate 125. The laser beams are optionally irradiated at substantially the same time such that with each radiated laser line an opening is created in the receiving substrate and a previously created opening is filled with deposited material. Optionally, the filled opening was created with the previous radiated line.

Optionally, direction 126 is at a slight angle to the circumference of source 53. Preferably, the velocity rotation of the polygon is stable and the controller controls the movement of the substrates.

Since the same scanning system performs both ablation and deposition, the alignment is relatively simple. The use of the same laser source optionally ensures that the laser beam ablating an opening in the passivation layer and the laser beam radiating the coating material for deposition will have substantially the same form. Preferably, the controller receives as an input the form of the coated lines on the source substrate in order to form the laser beam accordingly. The main requirement for alignment in system 700 is coordination between the velocity movement of the substrates and the rotation speed of polygon 122 such that the coating material will be deposed in the ablated opening. The velocity can optionally be determined as follows:

R (rounds per minute)=V(mm/sec)*60 sec/(d(mm)*N), where R is the rotation speed of polygon 122, V is the velocity of the movements of the substrates, d is the distance between the coated lines and N is the number of polygon facets.

The source and receiving substrates optionally move at the same velocity. Alternatively, the substrates do not move at the same velocity and the velocity movement of the receiving substrates is optionally constant while the velocity rotation of the source substrate is adjusted to compensate for any inaccuracy in the procedure.

Controller 147 further controls laser source 112 and, for example, turns the laser source off when a gap between two receiving substrates faces the laser beam.

Optionally, a sensor (not shown) is provided on source substrate 53 which communicated with controller 147 and informs the controller of its exact position and orientation. The sensor may be any sensor or optics known in the art. In addition, in accordance with an exemplary embodiment of the invention, small holes (not shown) are provided in the source substrate, for example next to the slits. A photodiode may be positioned below the substrate such that the photodiode will absorb the laser radiated through the holes and can provide an indication of accurateness of position of the source substrate. Additional coordinating or modulating means known in the art may be provided in accordance with an exemplary embodiment of the invention.

It is noted that some inaccuracies may be tolerated in accordance with at least some embodiment of the invention. For example, since both ablation and deposition are formed with the same set-up, the absolute position of the ablation has to be less accurate than when the ablation is performed with a separate system. In addition, a relatively large spot size of the laser beam for deposition can compensate for inaccuracies in irradiating the coating material at the source substrate.

System 700 is advantageous since it provides faster production of receiving substrates as the two procedures of ablation and deposition are performed in series using the same set-up. In addition, as the same system is used for ablation and deposition of material, easier alignment (or no need for additional alignment) is obtained between the coating lines and the ablated lines.

It is noted that stronger power is required for ablation than for deposition of the material, accordingly, laser beams 107 and 108 may be radiated at a different power. It is further noted that ablation at the front surface and back surface of the receiving substrate are at different energies and spot sized due to different depth and optionally also sizes of the openings. In addition, as explained with respect to FIG. 9, laser beams 107 and 108 may have different spot sizes.

In accordance with another exemplary embodiment of the invention, receiving substrates 41 are positioned on a turntable (not shown) which is coaxial with the disk. Receiving substrates 41 are loaded on the turntable before ablation and are removed therefrom after deposition of the material thereon. Loading and removing are performed according to any of the methods known in the art and can be automatic. Optionally, cleaning and/or filling stations as shown in FIG. 5A or 5D are added in order to provide relative continuous serial production of source substrates.

In an exemplary embodiment of the invention, two or more coating materials are deposited onto the receiving substrate. Optionally, the two or more coating materials are provided on the same source substrate and are deposited together or separately on the receiving substrate. Alternatively, two or more source substrates are provided having different coatings, and the coating material of the two or more source substrates are deposited on the same receiving substrate.

Figure 10:
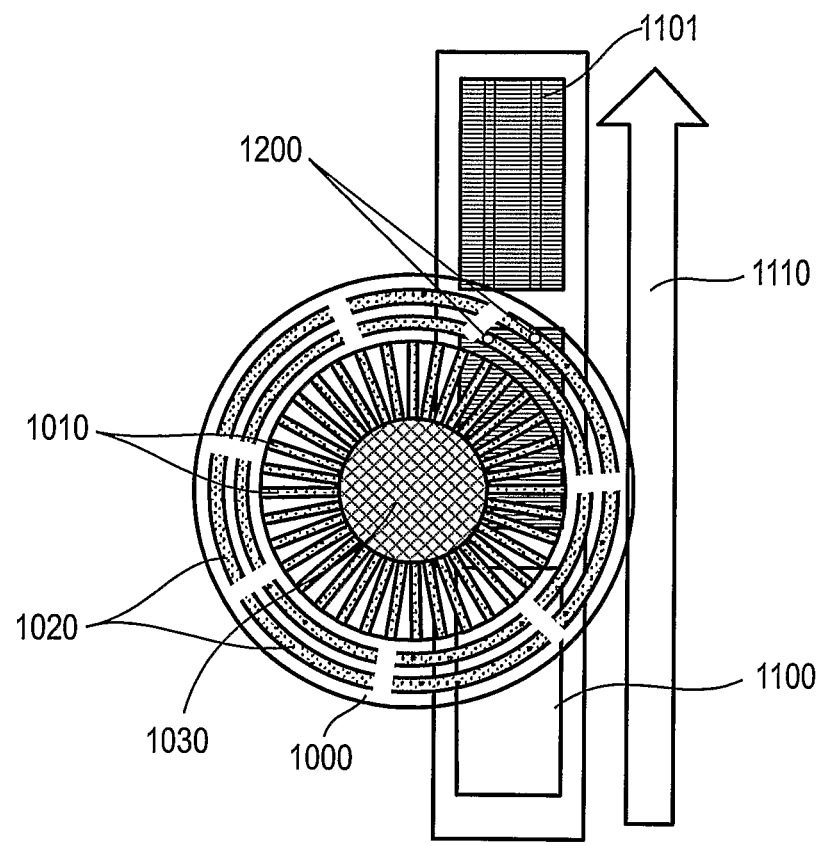
FIG. 10 illustrates a source substrate carrying different coating materials in accordance with an exemplary embodiment of the invention.

FIG. 10 illustrates a source substrate 1000 carrying different coating materials in accordance with an exemplary embodiment of the invention. Substrate 1000 carries a first coating material 1010 in the form of radial lines aligned relative to the center of round substrate 1000. A second coating material 1020 is provided as two interspaced round lines. The sections of interspaced round lines 1020 are preferably of the same length.

Source substrate 1000 can optionally be used for the production of solar cells. A solar cell generally carries a plurality of parallel lines with two busbars positioned on the lines and parallel thereto. As for example, produced source substrate 1101 shown in FIG. 10. The busbars are adapted to electrically connect two or more solar cells (produced receiving substrates) together.

At the front surface of the receiving substrate, the busbars may be made of the same material as the lines, for example silver. However, at the back surface of the receiving substrate, the busbars are required to have high solder-ability, while the lines at the back surface are preferably made of aluminum which has a relatively low solder-ability. Therefore, the busbars at the back surface are preferably made of a different material, for example silver based material such as silver aluminum. Thus, for the back surface, coating material 1010 and 1020 will be made from different materials.

Source substrate 1000 is adapted to be used with a scanning system similar to the one shown in FIG. 7. Source substrate 1000 rotates around its axis 1030 and a plurality of receiving substrates 1100 are conveyed below the source substrate and laser line radiation in a direction 1110 (as shown and detailed in FIG. 7).

A scanning system used for source substrate 1000 further includes two additional laser sources which radiate two laser spots 1200. Laser spots 1200 are radiated at coating material 1200 in order to deposit coating material 1020 on receiving substrate 1100 after deposition of lines 1010 thereon. During rotation of source 1000 and movement of receiving substrate 1100, the laser spot will deposit a line in a direction parallel to 1110. Laser spots 1200 may be wider than coating pattern 1200 in order to compensate for inaccuracies in alignment of the laser spot. For example, coating material 1020 may have a width of 2 mm while the laser spot may have a diameter of 3 mm or more. Preferable, the spot size should be small enough to ensure that a same laser spot will not radiate both coating lines 1020. Alternatively, only one laser spot 1200 is provided which is large enough to radiate both lines 1020.

The spaces between the coating lines 1200 are coordinated with the spaces between receiving substrates 1100 such that a coating line 1200 will be deposited on one receiving substrate and will end substantially at the end of the receiving substrate. it is noted that some inaccuracies of alignment of coating material 1200 may be tolerated, for example, the coating material does not have to deposited at the edge of the receiving substrate but may be deposited away the edge, for example about 100 μm-200 μm from the edge.

Another example for the use of different material in accordance with an exemplary embodiment of the invention is depositing a passivation pattern on the receiving substrate instead of creating openings in a passivation layer. The conductor material will then be deposed in the areas on the receiving substrate where no passivation material was deposed.

Although the above described exemplary embodiments all refer to a pattern of coating lines, an aspect of some embodiments of the invention also applies to any other uniform or non-uniform pattern consisting a plurality of unconnected coating pieces or a single coating piece which covers less than the entire back surface of the source substrate, for example less than 70%, 50% or 30% than the entire back surface of the source substrate.

Figure 8A:
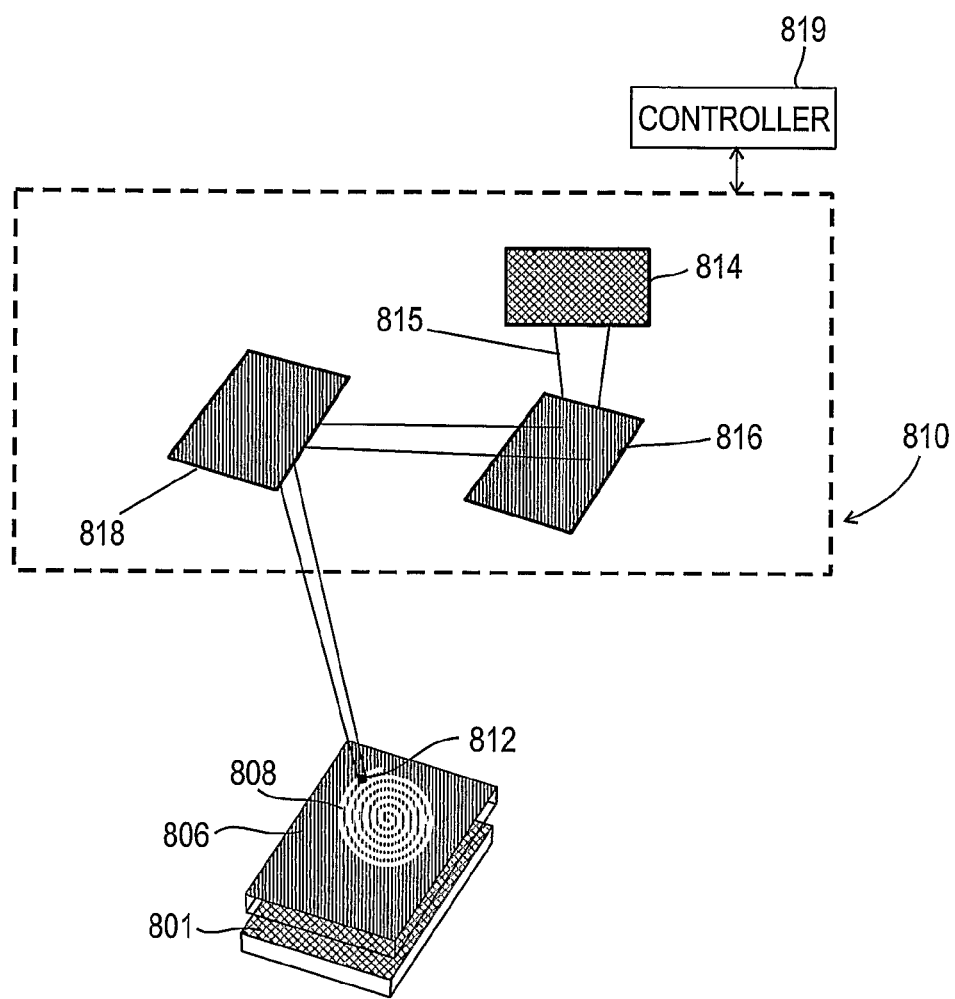
FIGS. 8A-8C are schematic illustrations of scanning systems adapted for use with non-lineal patterned coatings in accordance with exemplary embodiments of the invention.
Figure 8B:
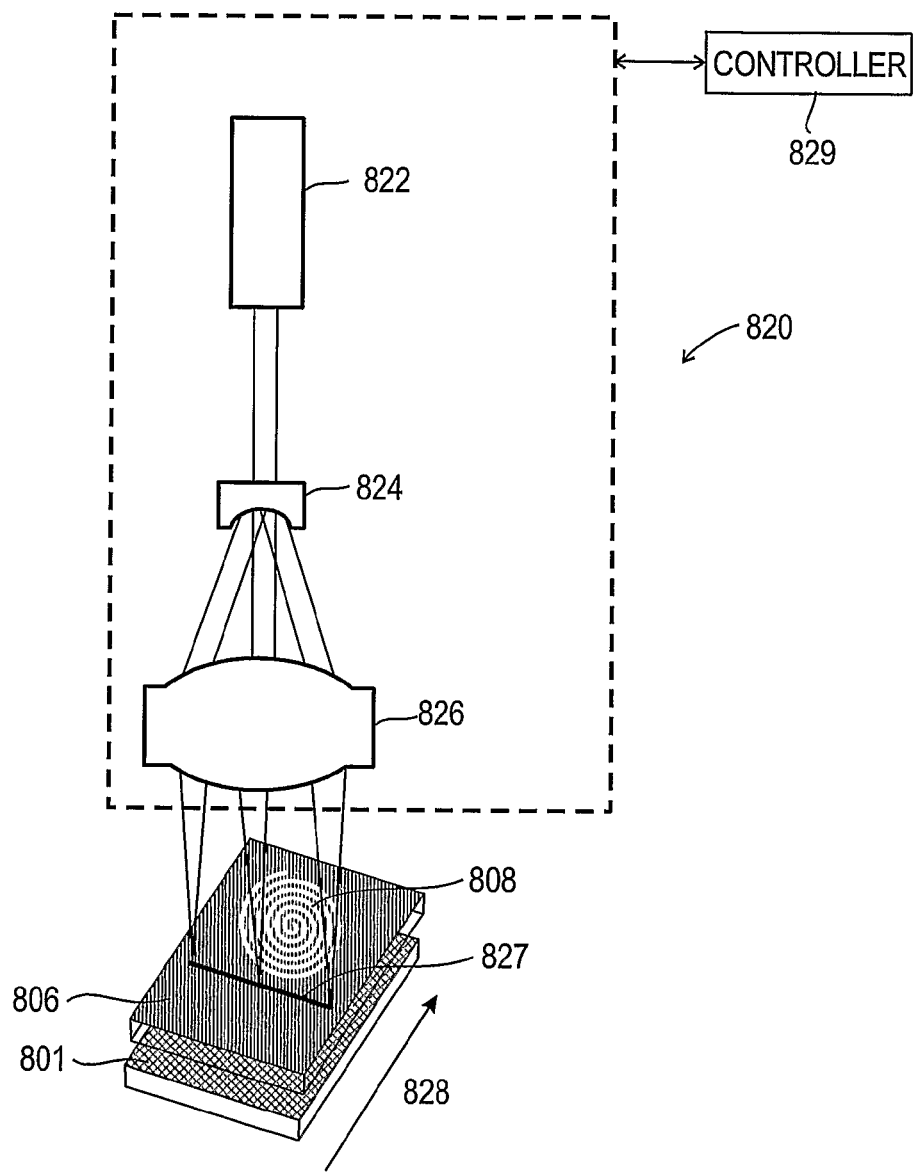
Figure 8C:
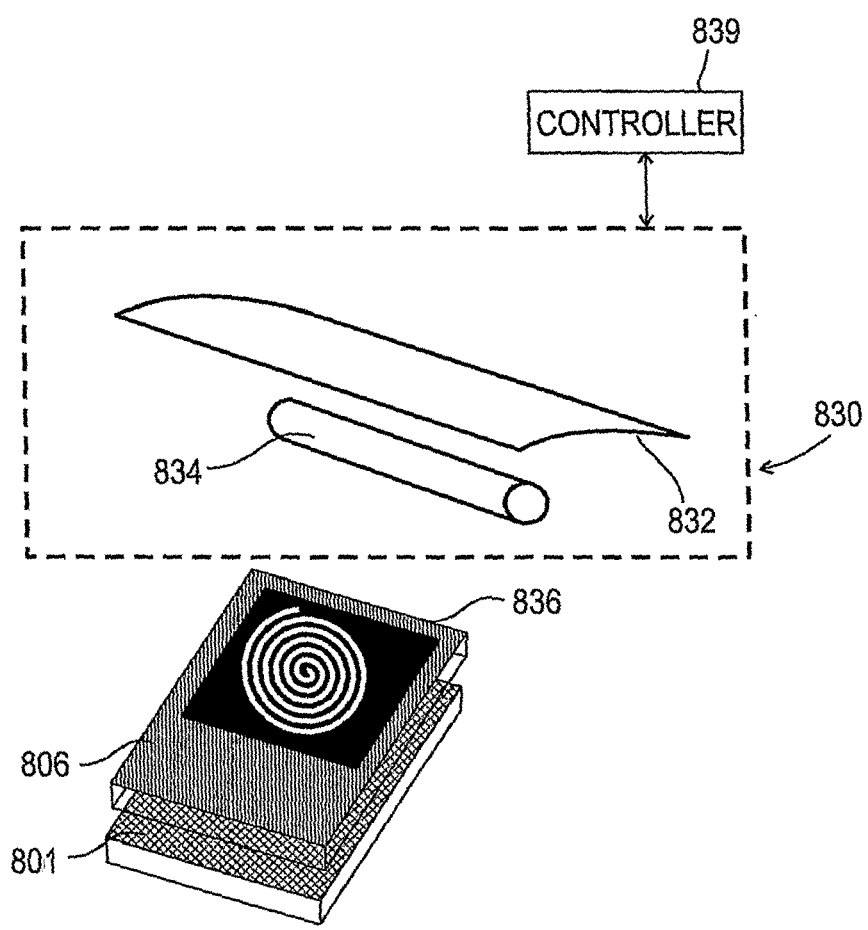

FIGS. 8A-8C for example illustrates exemplary scanning systems for use with other complex coating patterns, although they can be used for the patterns shown in FIG. 2 as well. A source substrate 806 is illustrated, carrying a spiral shaped coated pattern 808 on its back surface. Coating pattern 808 is to be deposited on a receiving substrate 801 while keeping its pattern.

FIG. 8A illustrates a scanning system 810 in accordance with an exemplary embodiment of the invention wherein a laser spot 812 follows the pattern of coating 808, thereby releasing patterned coating 808 from substrate 806 and depositing it onto receiving substrate 801. With this embodiment, there is no requirement that either of substrates 801 or 806 move during the scanning process.

System 810 consists of a laser source 814 which radiates a laser beam 815 onto a mirror 816 and is then reflected to a second mirror 816 and then to the source substrate. Mirrors 816 and 818 are controlled by a controller 819 to provide an x-y scanning system which follows the patterned coating. Controller 819 preferably receives as input the form of the patterned coating in order to provide a laser spot which follows the pattern. Mirrors 816 and 818 may optionally be controlled using markings on the substrate and/or coating. Other scanning methodologies used in the art can also be used.

Preferably, the patterned coating is deposited as a whole without being segmented during the deposition process. As with the scanning systems described above, applying one or more of low power of the laser beam and high velocity of radiation will assist in ensuring that the patterned coating is not segmented. Preferably, the power of the laser is not enough to detach the radiated coating from its surrounding material. In addition, the laser beam preferably moves fast enough such that the radiated material will not be deposited before radiation of its surrounding coating material.

FIG. 8B illustrates a scanning system 820 in accordance with another exemplary embodiment of the invention, wherein the non-uniform patterned coating is deposited using raster line scanning. System 820 is controlled by a controller 829 and includes a laser source 822, a beam scanner, for example a polygon, 824 and lens 826 which transfer a laser beam into a laser line 827. Alternatively, laser source 822 could radiate a laser line directly, without the need of polygon 824. Source substrate 806 and receiving substrate 801 move in a direction 828 substantially perpendicular to laser line 827. Laser line 827 scans the entire surface of source substrate 806, including the patterned coating and causes deposition of the patterned coating onto receiving substrate 801. Controller 829 controls the velocity movement of the substrates and the laser power to deposit the coated pattern as a whole. Low energy of the laser beam and high velocity of movement of the substrates will ensure that the coated pattern is not segmented during deposition and that there is no unwanted ablation of the passivation layer.

FIG. 8C illustrates a scanning system 830 in accordance with yet another exemplary embodiment of the invention where the entire pattern is illuminated at the same time. System 830 includes a light source 834 such as a broadband flash lamp and an optional mirror 832 which is preferably parabolic. Optionally, mirror 832 is elliptical. Light source 834 is controlled by controller 839 and radiates light which illuminates the entire area of the coated pattern, indicated as area 836 in FIG. 8C. This causes the entire coated pattern to disconnect from source substrate 806 at substantially the same time and deposit on receiving substrate 801. Optional mirror 832 assists in utilizing a large proportion of the light radiated by light source 834.

In an exemplary embodiment of the invention, the front surface and back surface of the receiving substrates are produced using the same scanning system. Optionally, the receiving substrate is first positioned in the scanning system with the front surface facing the coating material of the source substrate and the receiving substrate is then positioned in the scanning system with the back surface facing the coating material. Changes in ablating and depositing at the front and back surface are made as detailed above.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of depositing material on a receiving substrate, the method comprising:
   providing a source substrate having a back surface and a front surface, the back surface carrying at least one continuous piece of coating material;
   providing a receiving substrate positioned adjacent to the source substrate and facing the at least one continuous piece of coating material; and
   radiating light towards the front surface of the source substrate, to remove the at least one continuous piece of the coating material from the back surface of the source substrate as a whole, without detaching parts of the continuous piece from other parts of the continuous piece of coating material such that the entire continuous piece of the coating material is transferred as a whole onto the receiving substrate,
   wherein radiating light comprises scanning a light beam across the front surface of the source substrate to follow a pattern of said at least one continuous piece of coating material.

2. A method according to claim 1, wherein radiating light comprises radiating light which covers less than said at least one continuous piece of coating material.

3. A method according to claim 1, wherein radiating light comprises radiating a non-laser light beam.

4. A method according to claim 3, wherein radiating a non-laser light beam comprises radiating a broadband flash light beam.

5. A method according to claim 1, wherein radiating light comprises radiating a laser beam.

6. A method according to claim 5, wherein radiating light comprises radiating with a continuous laser radiation.

7. A method according to claim 5, wherein radiating light comprises radiating with a repetition pulsed laser.

8. A method according to claim 1, wherein radiating light towards the front surface of the source substrate comprises heating the at least one continuous piece of coating material thereby volatizing volatile material between the back surface of the source substrate and the at least one continuous piece of coating material, which provides a force for removing the at least one continuous piece of coating material from the back surface of the source substrate.

9. A method according to claim 1, wherein removal of the at least one continuous piece of the coating material, comprises removing a continuous piece which has an aspect ratio of more than 0.1.

10. A method according to claim 1, wherein removal of the at least one continuous piece of the coating material, comprises removing a continuous piece which has a height more than 5 µm.

11. A method according to claim 1, wherein radiating light towards the front surface of the source substrate, to remove the at least one continuous piece of the coating material from the source substrate comprises radiating the at least one continuous piece of coating material once to remove said at least one continuous piece of coating material from the source substrate as a whole.

12. A method according to claim 1 wherein radiating light comprises radiating a line.

13. A method according to claim 1, wherein radiating light comprises radiating light at a power less than 3 W.

14. A method according to claim 1 further comprising adding coating material to the source substrate at a portion from which the at least one continuous piece of coating material was deposited to the receiving substrate.

15. A method according to claim 1, further comprising cleaning the source substrate at a portion from which the at least one continuous piece of coating material was deposited to the receiving substrate.

16. A method according to claim 1, further comprising:
   radiating light towards the receiving substrate, to ablate openings in the receiving substrate.

17. A method according to claim 16, further comprising aligning the source and receiving substrates such that radiating light radiated towards the source substrate will cause the removed at least one continuous piece of coating material to be deposited in the ablated opening in the receiving substrate.

18. A method according to claim 1, wherein providing a source substrate comprises providing a source substrate wherein said at least one continuous piece of coating material includes a volatile admixture which volatizes when it is irradiated by the light.

19. A method according to claim 1, wherein providing a source substrate, comprises:
   providing a source substrate carrying said at least one continuous piece of coating material which coats less than an entire surface of the source substrate,
   wherein the source substrate comprises trenches in which the at least one continuous piece of coating material is positioned, wherein said trenches comprise a bottom surface and two sidewalls, the bottom surface and sidewalls of the trenches being coated with a material, and wherein the material coating the sidewalls has a lower surface energy than the material coating the bottom surface.

20. A method according to claim 19, wherein said trenches are formed as openings made in a metal layer coating the source substrate.

21. A method according to claim 19, wherein the bottom surface of the trenches is textured.

22. A method according to claim 19, wherein the source substrate carries at least two continuous pieces of coating material which are made from different materials.

23. A method according to claim 19, wherein the aspect ratio of the height and width of the at least one continuous piece of coating material is approximately equal or higher than 0.1.

24. A method according to claim 19, wherein the height of the at least one continuous piece of coating material is more than 5 μm.

25. A method according to claim 19, further comprising: providing a filling station adapted for filling the source substrate with coating material.

26. A method according to claim 19 further comprising: providing a cleaning station adapted for cleaning the source substrate after material deposition therefrom.

27. A method according to claim 19, wherein radiating light comprises radiating a broadband flash light beam.

28. A method according to claim 19, wherein radiating light comprises radiating a laser beam.

29. A method according to claim 28, wherein radiating light further comprises transforming the laser beam into a scan line.

30. A method according to claim 19, wherein radiating light comprises raster line scanning.

31. A method according to claim 19, wherein the at least one continuous piece of coating material includes a volatile admixture adapted to volatize when radiated by the light.

32. A method according to claim 19, further comprising admixturing a volatile between the source substrate and the at least one continuous piece of coating material.

33. A method according to claim 19, wherein the receiving substrate is positioned below the source substrate.

34. A method according to claim 1, wherein the source substrate is transparent to the radiated light.

35. A method according to claim 1, wherein the at least one continuous piece of coating material comprises a plurality of separate continuous pieces of material.

36. A method according to claim 35 wherein the separate continuous pieces of material are formed as lines.

37. A method according to claim 36 wherein the lines are straight lines.

38. A method according to claim 1, wherein the at least one continuous piece of coating material is formed as a spiral.

39. A method according to claim 1, further comprising providing an ablating light source adapted to radiate light for ablating openings in the receiving substrate.

40. A method according to claim 39 wherein the ablating light source and the light source used for radiating light towards the front surface of the source substrate, to remove the at least one continuous piece of the coating material from the back surface of the source substrate as a whole, comprise a single light source.

41. A method according to claim 39, wherein the ablating light source and the light source used for radiating light towards the front surface of the source substrate, to remove the at least one continuous piece of the coating material from the back surface of the source substrate as a whole, are two different light sources radiating light at different energies.

42. A method according to claim 39, further comprising, providing a controller adapted to align the source and receiving substrates such that the at least one continuous piece of coating material will be deposited in the openings in the receiving substrate.

43. A method according to claim 1, further comprising moving a plurality of receiving substrates below the radiated light.

44. A method according to claim 1, wherein said removed at least one continuous piece of coating material is not-segmented during transfer.

45. A method according to claim 1, wherein the source substrate comprises trenches in which the at least one continuous piece of coating material is positioned.

46. A method according to claim 45, wherein said trenches have a trapezoidal cross-section with the narrow base of the trapezoid facing the back surface of the source substrate and the wider base of the trapezoid facing outward.

47. A method according to claim 1, wherein the at least one continuous piece of coating material comprises metallic paste.

48. A method according to claim 1, wherein providing a source substrate comprises providing a source substrate comprising:
   a transparent substrate having a front surface and a back surface;
   a coating layer positioned on top of the transparent back surface; and
   a plurality of unconnected openings formed in the coating layer for positioning of coating material therein.

49. A method according to claim 48, wherein said coating material has a height of between 10 μm-300 μm.

50. A method according to claim 48, wherein said openings have a trapezoidal cross-section with the narrow base of the trapezoid facing the back surface and the wider base of the trapezoid facing outward.

51. A method according to claim 48, wherein the coating layer comprises a nickel layer.

52. A method according to claim 48, wherein the coating layer comprises a metal layer.

53. A method according to claim 48, wherein said plurality of openings are formed as straight lines.

54. A method according to claim 48, wherein the source substrate further comprises an intermediate layer between the back surface and the coating layer.

55. A method according to claim 48, wherein each of said openings comprise a bottom surface and two sidewalls, the bottom surface and sidewalls of the trenches being coated with a material, and wherein the material coating the sidewalls has a lower surface energy than the material coating the bottom surface.

56. A method according to claim 48, wherein each of said openings comprise a bottom surface which is textured.

57. A method of depositing material on a receiving substrate, the method comprising:
   providing a source substrate having a back surface and a front surface, the back surface carrying at least one continuous piece of coating material;
   providing a receiving substrate positioned adjacent to the source substrate and facing the at least one continuous piece of coating material; and
   radiating light towards the front surface of the source substrate, to remove the at least one continuous piece of coating material from the back surface of the source substrate as a whole, without detaching parts of the continuous piece from other parts of the continuous piece of coating material such that the entire continuous piece of coating material is transferred as a whole onto the receiving substrate, wherein radiating light comprises scanning a light beam across the front surface of the source substrate to follow a pattern of said at least one continuous piece of coating material, and wherein said continuous piece of coating material is removed from the source substrate starting at one end of the piece and removing proceeds during said pattern following of the radiating light until the entire piece is detached, without breaking the continuous piece during the detachment.

58. A method of depositing material on a receiving substrate, the method comprising:

providing a source substrate having a back surface and a front surface, the back surface comprising trenches in which coating material is positioned;

providing a receiving substrate positioned adjacent to the source substrate and facing the coating material; and radiating light towards the front surface of the source substrate, to remove one continuous piece of the coating material from one of said trenches in the back surface of the source substrate as a whole, without detaching parts of the one continuous piece from other parts of the one continuous piece of coating material such that the entire one continuous piece is transferred as a whole onto the receiving substrate, wherein radiating light comprises scanning a light beam across the front surface of the receiving substrate to follow a pattern of said trench.

59. A method according to claim 58, wherein said trenches have a trapezoidal cross-section with the narrow base of the trapezoid facing the back surface of the source substrate.

60. A method of depositing material on a receiving substrate, the method comprising:

providing a source substrate having a back surface and a front surface, the back surface carrying at least one continuous piece of metallic paste;

providing a receiving substrate positioned adjacent to the source substrate and facing the at least one continuous piece of metallic paste; and radiating light towards the front surface of the source substrate, to remove the at least one continuous piece of the metallic paste from the back surface of the source substrate as a whole, without detaching paste of the at least one continuous piece from other parts of the at least one continuous piece of metallic paste such that the entire continuous piece is transferred as a whole onto the receiving substrate, wherein radiating light comprises scanning a light beam across the front surface of the source substrate to follow a pattern of said at least one continuous piece of metallic paste.

61. A method according to claim 60, wherein said at least one continuous piece of metallic paste contains a volatile solvent.

62. A method according to claim 60, wherein said at least one continuous piece of metallic paste contains silver.

63. A method according to claim 60, wherein a viscosity of said at least one continuous piece of metallic paste is in the range of $10^4$ cP to $10^7$ cP.

64. A method according to claim 60, wherein the source substrate comprises trenches in which the metallic paste is positioned.

* * * * *